(12) United States Patent
Gorrell et al.

(10) Patent No.: US 7,557,647 B2
(45) Date of Patent: *Jul. 7, 2009

(54) HETERODYNE RECEIVER USING RESONANT STRUCTURES

(75) Inventors: Jonathan Gorrell, Gainesville, FL (US); Mark Davidson, Florahome, FL (US)

(73) Assignee: Virgin Islands Microsystems, Inc., St. Thomas, VI (US)

( * ) Notice: Subject to any disclaimer, the term of this patent is extended or adjusted under 35 U.S.C. 154(b) by 250 days.

This patent is subject to a terminal disclaimer.

(21) Appl. No.: 11/418,088

(22) Filed: May 5, 2006

(65) Prior Publication Data

US 2007/0257199 A1 Nov. 8, 2007

(51) Int. Cl.
*H03D 9/00* (2006.01)
(52) U.S. Cl. .............. 329/346; 250/336.1; 329/323; 329/324; 398/204; 398/207; 455/323; 455/329
(58) Field of Classification Search .......... 250/305, 250/336.1; 329/346, 323, 324; 455/260, 455/255; 398/204, 207; 359/293
See application file for complete search history.

(56) References Cited

U.S. PATENT DOCUMENTS

| | | |
|---|---|---|
| 1,948,384 A | 2/1934 | Lawrence |
| 2,307,086 A | 1/1943 | Varian et al. |
| 2,431,396 A | 11/1947 | Hansell |
| 2,473,477 A | 6/1949 | Smith |
| 2,634,372 A | 4/1953 | Salisbury |
| 2,932,798 A | 4/1960 | Kerst et al. |
| 2,944,183 A | 7/1960 | Drexler |
| 2,966,611 A | 12/1960 | Sandstrom |
| 3,231,779 A | 1/1966 | White |
| 3,297,905 A | 1/1967 | Rockwell et al. |
| 3,315,117 A | 4/1967 | Udelson |
| 3,387,169 A | 6/1968 | Farney |
| 3,543,147 A | 11/1970 | Kovarik |

(Continued)

FOREIGN PATENT DOCUMENTS

EP 0237559 B1 12/1991

(Continued)

OTHER PUBLICATIONS

U.S. Appl. No. 11/418,082, filed May 5, 2006, Gorrell et al.

(Continued)

*Primary Examiner*—Jack I Berman
*Assistant Examiner*—Michael Maskell
(74) *Attorney, Agent, or Firm*—Davidson Berquist Jackson & Gowdey LLP

(57) ABSTRACT

An electronic receiver for decoding data encoded into electromagnetic radiation (e.g., light) is described. The light is received at an ultra-small resonant structure. The resonant structure generates an electric field in response to the incident light and light received from a local oscillator. An electron beam passing near the resonant structure is altered on at least one characteristic as a result of the electric field. Data is encoded into the light by a characteristic that is seen in the electric field during resonance and therefore in the electron beam as it passes the electric field. Alterations in the electron beam are thus correlated to data values encoded into the light.

21 Claims, 13 Drawing Sheets

U.S. PATENT DOCUMENTS

| | | |
|---|---|---|
| 3,546,524 A | 12/1970 | Stark |
| 3,560,694 A | 2/1971 | White |
| 3,571,642 A | 3/1971 | Westcott |
| 3,586,899 A | 6/1971 | Fleisher |
| 3,761,828 A | 9/1973 | Pollard et al. |
| 3,886,399 A | 5/1975 | Symons |
| 3,923,568 A | 12/1975 | Bersin |
| 3,989,347 A | 11/1976 | Eschler |
| 4,053,845 A | 10/1977 | Gould |
| 4,282,436 A | 8/1981 | Kapetanakos |
| 4,450,554 A | 5/1984 | Steensma et al. |
| 4,482,779 A | 11/1984 | Anderson |
| 4,528,659 A | 7/1985 | Jones, Jr. |
| 4,589,107 A | 5/1986 | Middleton et al. |
| 4,598,397 A | 7/1986 | Nelson et al. |
| 4,630,262 A | 12/1986 | Callens et al. |
| 4,652,703 A | 3/1987 | Lu et al. |
| 4,661,783 A | 4/1987 | Gover et al. |
| 4,704,583 A | 11/1987 | Gould |
| 4,712,042 A | 12/1987 | Hamm |
| 4,713,581 A | 12/1987 | Haimson |
| 4,727,550 A | 2/1988 | Chang et al. |
| 4,740,963 A | 4/1988 | Eckley |
| 4,740,973 A | 4/1988 | Madey |
| 4,746,201 A | 5/1988 | Gould |
| 4,761,059 A | 8/1988 | Yeh et al. |
| 4,782,485 A | 11/1988 | Gollub |
| 4,789,945 A | 12/1988 | Niijima |
| 4,806,859 A | 2/1989 | Hetrick |
| 4,809,271 A | 2/1989 | Kondo et al. |
| 4,813,040 A | 3/1989 | Futato |
| 4,819,228 A | 4/1989 | Baran et al. |
| 4,829,527 A | 5/1989 | Wortman et al. |
| 4,838,021 A | 6/1989 | Beattie |
| 4,841,538 A | 6/1989 | Yanabu et al. |
| 4,864,131 A | 9/1989 | Rich et al. |
| 4,866,704 A | 9/1989 | Bergman |
| 4,866,732 A | 9/1989 | Carey et al. |
| 4,873,715 A | 10/1989 | Shibata |
| 4,887,265 A | 12/1989 | Felix |
| 4,890,282 A | 12/1989 | Lambert et al. |
| 4,898,022 A | 2/1990 | Yumoto et al. |
| 4,912,705 A | 3/1990 | Paneth et al. |
| 4,932,022 A | 6/1990 | Keeney et al. |
| 4,981,371 A | 1/1991 | Gurak et al. |
| 5,023,563 A | 6/1991 | Harvey et al. |
| 5,036,513 A | 7/1991 | Greenblatt |
| 5,065,425 A | 11/1991 | Lecomte et al. |
| 5,113,141 A | 5/1992 | Swenson |
| 5,121,385 A | 6/1992 | Tominaga et al. |
| 5,127,001 A | 6/1992 | Steagall et al. |
| 5,128,729 A | 7/1992 | Alonas et al. |
| 5,130,985 A | 7/1992 | Kondo et al. |
| 5,150,410 A | 9/1992 | Bertrand |
| 5,155,726 A | 10/1992 | Spinney et al. |
| 5,157,000 A | 10/1992 | Elkind et al. |
| 5,163,118 A | 11/1992 | Lorenzo et al. |
| 5,185,073 A | 2/1993 | Bindra |
| 5,187,591 A | 2/1993 | Guy et al. |
| 5,199,918 A | 4/1993 | Kumar |
| 5,214,650 A | 5/1993 | Renner et al. |
| 5,233,623 A | 8/1993 | Chang |
| 5,235,248 A | 8/1993 | Clark et al. |
| 5,262,656 A | 11/1993 | Blondeau et al. |
| 5,263,043 A | 11/1993 | Walsh |
| 5,268,693 A | 12/1993 | Walsh |
| 5,268,788 A | 12/1993 | Fox et al. |
| 5,282,197 A | 1/1994 | Kreitzer |
| 5,283,819 A | 2/1994 | Glick et al. |
| 5,293,175 A | 3/1994 | Hemmie et al. |
| 5,302,240 A | 4/1994 | Hori et al. |
| 5,305,312 A | 4/1994 | Fornek et al. |
| 5,341,374 A | 8/1994 | Lewen et al. |
| 5,354,709 A | 10/1994 | Lorenzo et al. |
| 5,446,814 A | 8/1995 | Kuo et al. |
| 5,504,341 A | 4/1996 | Glavish |
| 5,578,909 A | 11/1996 | Billen |
| 5,604,352 A | 2/1997 | Schuetz |
| 5,608,263 A | 3/1997 | Drayton et al. |
| 5,663,971 A | 9/1997 | Carlsten |
| 5,666,020 A | 9/1997 | Takemura |
| 5,668,368 A | 9/1997 | Sakai et al. |
| 5,705,443 A | 1/1998 | Stauf et al. |
| 5,737,458 A | 4/1998 | Wojnarowski et al. |
| 5,744,919 A | 4/1998 | Mishin et al. |
| 5,757,009 A | 5/1998 | Walstrom |
| 5,767,013 A | 6/1998 | Park |
| 5,780,970 A | 7/1998 | Singh et al. |
| 5,790,585 A | 8/1998 | Walsh |
| 5,811,943 A | 9/1998 | Mishin et al. |
| 5,821,836 A | 10/1998 | Katehi et al. |
| 5,821,902 A | 10/1998 | Keen |
| 5,825,140 A | 10/1998 | Fujisawa |
| 5,831,270 A | 11/1998 | Nakasuji |
| 5,847,745 A | 12/1998 | Shimizu et al. |
| 5,889,449 A | 3/1999 | Fiedziuszko |
| 5,889,797 A | 3/1999 | Nguyen |
| 5,902,489 A | 5/1999 | Yasuda et al. |
| 5,963,857 A | 10/1999 | Greywall |
| 6,005,347 A | 12/1999 | Lee |
| 6,008,496 A | 12/1999 | Winefordner et al. |
| 6,040,625 A | 3/2000 | Ip |
| 6,060,833 A | 5/2000 | Velazco |
| 6,080,529 A | 6/2000 | Ye et al. |
| 6,139,760 A | 10/2000 | Shim et al. |
| 6,180,415 B1 | 1/2001 | Schultz et al. |
| 6,195,199 B1 | 2/2001 | Yamada |
| 6,222,866 B1 | 4/2001 | Seko |
| 6,278,239 B1 | 8/2001 | Caporaso et al. |
| 6,281,769 B1 | 8/2001 | Fiedziuszko |
| 6,297,511 B1 | 10/2001 | Syllaios et al. |
| 6,301,041 B1 | 10/2001 | Yamada |
| 6,316,876 B1 | 11/2001 | Tanabe |
| 6,338,968 B1 | 1/2002 | Hefti |
| 6,370,306 B1 | 4/2002 | Sato et al. |
| 6,373,194 B1 | 4/2002 | Small |
| 6,376,258 B2 | 4/2002 | Hefti |
| 6,407,516 B1 | 6/2002 | Victor |
| 6,441,298 B1 | 8/2002 | Thio |
| 6,448,850 B1 | 9/2002 | Yamada |
| 6,453,087 B2 | 9/2002 | Frish et al. |
| 6,470,198 B1 | 10/2002 | Kintaka et al. |
| 6,504,303 B2 | 1/2003 | Small |
| 6,525,477 B2 | 2/2003 | Small |
| 6,534,766 B2 | 3/2003 | Abe et al. |
| 6,545,425 B2 | 4/2003 | Victor |
| 6,552,320 B1 | 4/2003 | Pan |
| 6,577,040 B2 | 6/2003 | Nguyen |
| 6,580,075 B2 | 6/2003 | Kametani et al. |
| 6,603,781 B1 | 8/2003 | Stinson et al. |
| 6,603,915 B2 | 8/2003 | Glebov et al. |
| 6,624,916 B1 | 9/2003 | Green et al. |
| 6,636,185 B1 | 10/2003 | Spitzer et al. |
| 6,636,534 B2 | 10/2003 | Madey et al. |
| 6,636,653 B2 | 10/2003 | Miracky et al. |
| 6,640,023 B2 | 10/2003 | Miller et al. |
| 6,642,907 B2 | 11/2003 | Hamada et al. |
| 6,687,034 B2 | 2/2004 | Wine et al. |
| 6,724,486 B1 | 4/2004 | Shull et al. |
| 6,738,176 B2 | 5/2004 | Rabinowitz et al. |
| 6,741,781 B2 | 5/2004 | Furuyama |
| 6,782,205 B2 | 8/2004 | Trisnadi et al. |
| 6,791,438 B2 | 9/2004 | Takahashi et al. |
| 6,800,877 B2 | 10/2004 | Victor et al. |

| Patent/Pub No. | Date | Name |
|---|---|---|
| 6,801,002 B2 | 10/2004 | Victor et al. |
| 6,819,432 B2 | 11/2004 | Pepper et al. |
| 6,829,286 B1 | 12/2004 | Guilfoyle et al. |
| 6,834,152 B2 | 12/2004 | Gunn et al. |
| 6,870,438 B1 | 3/2005 | Shino et al. |
| 6,871,025 B2 | 3/2005 | Maleki et al. |
| 6,885,262 B2 | 4/2005 | Nishimura et al. |
| 6,900,447 B2 | 5/2005 | Gerlach et al. |
| 6,909,092 B2 | 6/2005 | Nagahama |
| 6,909,104 B1 | 6/2005 | Koops |
| 6,924,920 B2 | 8/2005 | Zhilkov |
| 6,936,981 B2 | 8/2005 | Gesley |
| 6,943,650 B2 | 9/2005 | Ramprasad et al. |
| 6,944,369 B2 | 9/2005 | Deliwala |
| 6,952,492 B2 | 10/2005 | Tanaka et al. |
| 6,953,291 B2 | 10/2005 | Liu |
| 6,954,515 B2 | 10/2005 | Bjorkholm et al. |
| 6,965,284 B2 | 11/2005 | Maekawa et al. |
| 6,965,625 B2 | 11/2005 | Mross et al. |
| 6,972,439 B1 | 12/2005 | Kim et al. |
| 6,995,406 B2 | 2/2006 | Tojo et al. |
| 7,010,183 B2 | 3/2006 | Estes et al. |
| 7,064,500 B2 | 6/2006 | Victor et al. |
| 7,068,948 B2 | 6/2006 | Wei et al. |
| 7,092,588 B2 | 8/2006 | Kondo |
| 7,092,603 B2 | 8/2006 | Glebov et al. |
| 7,122,978 B2 | 10/2006 | Nakanishi et al. |
| 7,130,102 B2 | 10/2006 | Rabinowitz |
| 7,177,515 B2 | 2/2007 | Estes et al. |
| 7,230,201 B1 | 6/2007 | Miley et al. |
| 7,253,426 B2 | 8/2007 | Gorrell et al. |
| 7,267,459 B2 | 9/2007 | Matheson |
| 7,267,461 B2 | 9/2007 | Kan et al. |
| 7,309,953 B2 | 12/2007 | Tiberi et al. |
| 7,342,441 B2 * | 3/2008 | Gorrell et al. .............. 329/346 |
| 7,362,972 B2 | 4/2008 | Yavor et al. |
| 7,375,631 B2 | 5/2008 | Moskowitz et al. |
| 7,436,177 B2 | 10/2008 | Gorrell et al. |
| 7,442,940 B2 | 10/2008 | Gorrell et al. |
| 7,443,358 B2 | 10/2008 | Gorrell et al. |
| 7,470,920 B2 | 12/2008 | Gorrell et al. |
| 7,473,917 B2 | 1/2009 | Singh |
| 2001/0025925 A1 | 10/2001 | Abe et al. |
| 2002/0009723 A1 | 1/2002 | Hefti |
| 2002/0027481 A1 | 3/2002 | Fiedziuszko |
| 2002/0036121 A1 | 3/2002 | Ball et al. |
| 2002/0036264 A1 | 3/2002 | Nakasuji et al. |
| 2002/0053638 A1 | 5/2002 | Winkler et al. |
| 2002/0068018 A1 | 6/2002 | Pepper et al. |
| 2002/0070671 A1 | 6/2002 | Small |
| 2002/0071457 A1 | 6/2002 | Hogan |
| 2002/0135665 A1 | 9/2002 | Gardner |
| 2002/0191650 A1 | 12/2002 | Madey et al. |
| 2003/0010979 A1 | 1/2003 | Pardo |
| 2003/0012925 A1 | 1/2003 | Gorrell |
| 2003/0016412 A1 | 1/2003 | Eilenberger et al. |
| 2003/0016421 A1 | 1/2003 | Small |
| 2003/0034535 A1 | 2/2003 | Barenburu et al. |
| 2003/0103150 A1 | 6/2003 | Catrysse et al. |
| 2003/0106998 A1 | 6/2003 | Colbert et al. |
| 2003/0155521 A1 | 8/2003 | Feuerbaum |
| 2003/0158474 A1 | 8/2003 | Scherer et al. |
| 2003/0164947 A1 | 9/2003 | Vaupel |
| 2003/0179974 A1 | 9/2003 | Estes et al. |
| 2003/0206708 A1 | 11/2003 | Estes et al. |
| 2003/0214695 A1 | 11/2003 | Abramson et al. |
| 2004/0061053 A1 | 4/2004 | Taniguchi et al. |
| 2004/0080285 A1 | 4/2004 | Victor et al. |
| 2004/0085159 A1 | 5/2004 | Kubena et al. |
| 2004/0092104 A1 | 5/2004 | Gunn, III et al. |
| 2004/0108471 A1 | 6/2004 | Luo et al. |
| 2004/0108473 A1 | 6/2004 | Melnychuk et al. |
| 2004/0136715 A1 | 7/2004 | Kondo |
| 2004/0150991 A1 | 8/2004 | Ouderkirk et al. |
| 2004/0171272 A1 | 9/2004 | Jin et al. |
| 2004/0180244 A1 | 9/2004 | Tour et al. |
| 2004/0184270 A1 | 9/2004 | Halter |
| 2004/0213375 A1 | 10/2004 | Bjorkholm et al. |
| 2004/0217297 A1 | 11/2004 | Moses et al. |
| 2004/0218651 A1 | 11/2004 | Iwasaki et al. |
| 2004/0231996 A1 | 11/2004 | Webb |
| 2004/0240035 A1 * | 12/2004 | Zhilkov .............. 359/293 |
| 2004/0264867 A1 | 12/2004 | Kondo |
| 2005/0023145 A1 | 2/2005 | Cohen et al. |
| 2005/0045821 A1 | 3/2005 | Noji et al. |
| 2005/0045832 A1 | 3/2005 | Kelly et al. |
| 2005/0054151 A1 | 3/2005 | Lowther et al. |
| 2005/0067286 A1 | 3/2005 | Ahn et al. |
| 2005/0082469 A1 | 4/2005 | Carlo |
| 2005/0092929 A1 | 5/2005 | Schneiker |
| 2005/0104684 A1 | 5/2005 | Wojcik et al. |
| 2005/0105690 A1 | 5/2005 | Pau et al. |
| 2005/0145882 A1 | 7/2005 | Taylor et al. |
| 2005/0152635 A1 | 7/2005 | Paddon et al. |
| 2005/0162104 A1 | 7/2005 | Victor et al. |
| 2005/0190637 A1 | 9/2005 | Ichimura et al. |
| 2005/0194258 A1 | 9/2005 | Cohen et al. |
| 2005/0201707 A1 | 9/2005 | Glebov et al. |
| 2005/0201717 A1 | 9/2005 | Matsumura et al. |
| 2005/0212503 A1 | 9/2005 | Deibele |
| 2005/0231138 A1 | 10/2005 | Nakanishi et al. |
| 2005/0249451 A1 | 11/2005 | Baehr-Jones et al. |
| 2005/0285541 A1 | 12/2005 | LeChevalier |
| 2006/0007730 A1 | 1/2006 | Nakamura et al. |
| 2006/0018619 A1 | 1/2006 | Helffrich et al. |
| 2006/0035173 A1 | 2/2006 | Davidson et al. |
| 2006/0045418 A1 | 3/2006 | Cho et al. |
| 2006/0050269 A1 | 3/2006 | Brownell |
| 2006/0060782 A1 | 3/2006 | Khursheed |
| 2006/0062258 A1 | 3/2006 | Brau et al. |
| 2006/0131695 A1 | 6/2006 | Kuekes et al. |
| 2006/0159131 A1 | 7/2006 | Liu et al. |
| 2006/0164496 A1 | 7/2006 | Tokutake et al. |
| 2006/0187794 A1 | 8/2006 | Harvey et al. |
| 2006/0216940 A1 | 9/2006 | Gorrell et al. |
| 2006/0243925 A1 | 11/2006 | Barker et al. |
| 2006/0274922 A1 | 12/2006 | Ragsdale |
| 2007/0003781 A1 | 1/2007 | de Rochemont |
| 2007/0013765 A1 | 1/2007 | Hudson et al. |
| 2007/0075264 A1 | 4/2007 | Gorrell et al. |
| 2007/0086915 A1 | 4/2007 | LeBoeuf et al. |
| 2007/0116420 A1 | 5/2007 | Estes et al. |
| 2007/0146704 A1 | 6/2007 | Schmidt et al. |
| 2007/0152176 A1 | 7/2007 | Gorrell et al. |
| 2007/0154846 A1 | 7/2007 | Gorrell et al. |
| 2007/0194357 A1 | 8/2007 | Oohashi et al. |
| 2007/0200940 A1 | 8/2007 | Gruhlke et al. |
| 2007/0252983 A1 | 11/2007 | Tong et al. |
| 2007/0258689 A1 | 11/2007 | Gorrell et al. |
| 2007/0258690 A1 | 11/2007 | Gorrell et al. |
| 2007/0259641 A1 | 11/2007 | Gorrell |
| 2007/0264023 A1 | 11/2007 | Gorrell et al. |
| 2007/0264030 A1 | 11/2007 | Gorrell et al. |
| 2007/0284527 A1 | 12/2007 | Zani et al. |
| 2008/0069509 A1 | 3/2008 | Gorrell et al. |
| 2008/0302963 A1 | 12/2008 | Nakasuji et al. |

FOREIGN PATENT DOCUMENTS

| | | |
|---|---|---|
| WO | WO 87/01873 | 3/1987 |
| WO | WO 93/21663 A1 | 10/1993 |
| WO | WO 00/72413 | 11/2000 |
| WO | WO 2000/072413 | 11/2000 |
| WO | WO 02/25785 | 3/2002 |
| WO | WO 02/077607 | 10/2002 |
| WO | WO 2004/086560 | 10/2004 |

| WO | WO 2005/015143 A2 | 2/2005 |
| WO | WO 2005/098966 | 10/2005 |
| WO | WO 2006/042239 A2 | 4/2006 |
| WO | WO 2007/081389 | 7/2007 |
| WO | WO 2007/081390 | 7/2007 |
| WO | WO 2007/081391 | 7/2007 |

OTHER PUBLICATIONS

J. C. Palais, "Fiber optic communications," Prentice Hall, New Jersey, 1998, pp. 156-158.

Search Report and Written Opinion mailed Dec. 20, 2007 in PCT Appln. No. PCT/US2006/022771.

Search Report and Written Opinion mailed Jan. 31, 2008 in PCT Appln. No. PCT/US2006/027427.

Search Report and Written Opinion mailed Jan. 8, 2008 in PCT Appln. No. PCT/US2006/028741.

Search Report and Written Opinion mailed Mar. 11, 2008 in PCT Appln. No. PCT/US2006/022679.

Lee Kwang-Cheol et al., "Deep X-Ray Mask with Integrated Actuator for 3D Microfabrication", Conference: Pacific Rim Workshop on Transducers and Micro/Nano Technologies, (Xiamen CHN), Jul. 22, 2002.

Markoff, John, "A Chip That Can Transfer Data Using Laser Light," The New York Times, Sep. 18, 2006.

S.M. Sze, "Semiconductor Devices Physics and Technology", 2nd Edition, Chapters 9 and 12, Copyright 1985, 2002.

Search Report and Written Opinion mailed Feb. 12, 2007 in PCT Appln. No. PCT/US2006/022682.

Search Report and Written Opinion mailed Feb. 20, 2007 in PCT Appln. No. PCT/US2006/022676.

Search Report and Written Opinion mailed Feb. 20, 2007 in PCT Appln. No. PCT/US2006/022772.

Search Report and Written Opinion mailed Feb. 20, 2007 in PCT Appln. No. PCT/US2006/022780.

Search Report and Written Opinion mailed Feb. 21, 2007 in PCT Appln. No. PCT/US2006/022684.

Search Report and Written Opinion mailed Jan. 17, 2007 in PCT Appln. No. PCT/US2006/022777.

Search Report and Written Opinion mailed Jan. 23, 2007 in PCT Appln. No. PCT/US2006/022781.

Search Report and Written Opinion mailed Mar. 7, 2007 in PCT Appln. No. PCT/US2006/022775.

Speller et al., "A Low-Noise MEMS Accelerometer for Unattended Ground Sensor Applications", Applied MEMS Inc., 12200 Parc Crest, Stafford, TX, USA 77477.

Thurn-Albrecht et al., "Ultrahigh-Density Nanowire Arrays Grown in Self-Assembled Diblock Copolymer Templates", Science 290. 5499, Dec. 15, 2000, pp. 2126-2129.

"Array of Nanoklystrons for Frequency Agility or Redundancy," NASA's Jet Propulsion Laboratory, NASA Tech Briefs, NPO-21033. 2001.

"Hardware Development Programs," Calabazas Creek Research, Inc. found at http://calcreek.com/hardware.html.

"Antenna Arrays." May 18, 2002. www.tpub.com/content/neets/14183/css/14183_159.htm.

"Diffraction Grating," hyperphysics.phy-astr.gsu.edu/hbase/phyopt/grating.html.

Alford, T.L. et al., "Advanced silver-based metallization patterning for ULSI applications," Microelectronic Engineering 55, 2001, pp. 383-388, Elsevier Science B.V.

Amato, Ivan, "An Everyman's Free-Electron Laser?" Science, New Series, Oct. 16, 1992, p. 401, vol. 258 No. 5081, American Association for the Advancement of Science.

Andrews, H.L. et al., "Dispersion and Attenuation in a Smith-Purcell Free Electron Laser," The American Physical Society, Physical Review Special Topics—Accelerators and Beams 8 (2005), pp. 050703-1—050703-9.

Backe, H. et al. "Investigation of Far-Infrared Smith-Purcell Radiation at the 3.41 MeV Electron Injector Linac of the Mainz Microtron MAMI," Institut fur Kernphysik, Universitat Mainz, D-55099, Mainz Germany.

Bakhtyari, A. et al., "Horn Resonator Boosts Miniature Free-Electron Laser Power,"Applied Physics Letters, May 12, 2003, pp. 3150-3152, vol. 82, No. 19, American Institute of Physics.

Bakhtyari, Dr. Arash, "Gain Mechanism in a Smith-Purcell MicroFEL," Abstract, Department of Physics and Astronomy, Dartmouth College.

Bhattacharjee, Sudeep et al., "Folded Waveguide Traveling-Wave Tube Sources for Terahertz Radiation." IEEE Transactions on Plasma Science, vol. 32. No. 3, Jun. 2004, pp. 1002-1014.

Booske, J.H. et al., "Microfabricated TWTs as High Power, Wideband Sources of THz Radiation".

Brau, C.A. et al., "Gain and Coherent Radiation from a Smith-Purcell Free Electron Laser," Proceedings of the 2004 FEL Conference, pp. 278-281.

Brownell, J.H. et al., "Improved μFEL Performance with Novel Resonator," Jan. 7, 2005, from website: www.frascati.enea.it/thz-bridge/workshop/presentations/Wednesday/We-07-Brownell.ppt.

Brownell, J.H. et al., "The Angular Distribution of the Power Produced by Smith-Purcell Radiation," J. Phys. D: Appl. Phys. 1997, pp. 2478-2481, vol. 30, IOP Publishing Ltd., United Kingdom.

Chuang, S.L. et al., "Enhancement of Smith-Purcell Radiation from a Grating with Surface-Plasmon Excitation," Journal of the Optical Society of America, Jun. 1984, pp. 672-676, vol. 1 No. 6, Optical Society of America.

Chuang, S.L. et al., "Smith-Purcell Radiation from a Charge Moving Above a Penetrable Grating," IEEE MTT-S Digest, 1983, pp. 405-406, IEEE.

Far-IR, Sub-MM & MM Detector Technology Workshop list of manuscripts, session 6 2002.

Feltz, W.F. et al., "Near-Continuous Profiling of Temperature, Moisture, and Atmospheric Stability Using the Atmospheric Emitted Radiance Interferometer (AERI)," Journal of Applied Meterology, May 2003, vol. 42 No. 5, H.W. Wilson Company, pp. 584-597.

Freund, H.P. et al., "Linearized Field Theory of a Smith-Purcell Traveling Wave Tube," IEEE Transactions on Plasma Science, Jun. 2004, pp. 1015-1027, vol. 32 No. 3, IEEE.

Gallerano, G.P. et al., "Overview of Terahertz Radiation Sources," Proceedings of the 2004 FEL Conference, pp. 216-221.

Goldstein, M. et al., "Demonstration of a Micro Far-Infrared Smith-Purcell Emitter," Applied Physics Letters, Jul. 28, 1997, pp. 452-454, vol. 71 No. 4, American Institute of Physics.

Gover, A. et al., "Angular Radiation Pattern of Smith-Purcell Radiation," Journal of the Optical Society of America, Oct. 1984, pp. 723-728, vol. 1 No. 5, Optical Society of America.

Grishin, Yu. A. et al., "Pulsed Orotron—A New Microwave Source for Submillimeter Pulse High-Field Electron Paramagnetic Resonance Spectroscopy," Review of Scientific Instruments, Sep. 2004, pp. 2926-2936, vol. 75 No. 9, American Institute of Physics.

Ishizuka, H. et al., "Smith-Purcell Experiment Utilizing a Field-Emitter Array Cathode: Measurements of Radiation," Nuclear Instruments and Methods in Physics Research, 2001, pp. 593-598, A 475, Elsevier Science B.V.

Ishizuka, H. et al., "Smith-Purcell Radiation Experiment Using a Field-Emission Array Cathode," Nuclear Instruments and Methods in Physics Research, 2000, pp. 276-280, A 445, Elsevier Science B.V.

Ives, Lawrence et al., "Development of Backward Wave Oscillators for Terahertz Applications," Terahertz for Military and Security Applications, Proceedings of SPIE vol. 5070 (2003), pp. 71-82.

Ives, R. Lawrence, "IVEC Summary, Session 2, Sources I" 2002.

Jonietz, Erika, "Nano Antenna Gold nanospheres show path to all-optical computing," Technology Review, Dec. 2005/Jan. 2006, p. 32.

Joo, Youngcheol et al., "Air Cooling of IC Chip with Novel Microchannels Monolithically Formed on Chip Front Surface," Cooling and Thermal Design of Electronic Systems (HTD-vol. 319 & EEP-vol. 15), International Mechanical Engineering Congress and Exposition, San Francisco, CA Nov. 1995, pp. 117-121.

Joo, Youngcheol et al., "Fabrication of Monolithic Microchannels for IC Chip Cooling," 1995, Mechanical, Aerospace and Nuclear Engineering Department, University of California at Los Angeles.

Jung, K.B. et al., "Patterning of Cu, Co, Fe, and Ag for magnetic nanostructures,"J. Vac. Sci. Technol. A 15(3), May/Jun. 1997, pp. 1780-1784.

Kapp, Oscar H. et al., "Modification of a Scanning Electron Microscope to Produce Smith-Purcell Radiation," Review of Scientific Instruments, Nov. 2004, pp. 4732-4741, vol. 75 No. 11, American Institute of Physics.

Kiener, C. et al., "Investigation of the Mean Free Path of Hot Electrons in GaAs/AlGaAs Heterostructures," Semicond. Sci. Technol., 1994, pp. 193-197, vol. 9, IOP Publishing Ltd., United Kingdom.

Kim, Shang Hoon, "Quantum Mechanical Theory of Free-Electron Two-Quantum Stark Emission Driven by Transverse Motion," Journal of the Physical Society of Japan, Aug. 1993, vol. 62 No. 8, pp. 2528-2532.

Korbly, S.E. et al., "Progress on a Smith-Purcell Radiation Bunch Length Diagnostic," Plasma Science and Fusion Center, MIT, Cambridge, MA.

Kormann, T. et al., "A Photoelectron Source for the Study of Smith-Purcell Radiation".

Kube, G. et al., "Observation of Optical Smith-Purcell Radiation at an Electron Beam Energy of 855 MeV," Physical Review E, May 8, 2002, vol. 65, The American Physical Society, pp. 056501-1-056501-15.

Liu, Chuan Sheng, et al., "Stimulated Coherent Smith-Purcell Radiation from a Metallic Grating," IEEE Journal of Quantum Electronics, Oct. 1999, pp. 1386-1389, vol. 35, No. 10, IEEE.

Manohara, Harish et al., "Field Emission Testing of Carbon Nanotubes for THz Frequency Vacuum Microtube Sources." Abstract. Dec. 2003. from SPIEWeb.

Manohara, Harish M. et al., "Design and Fabrication of a THz Nanoklystron".

Manohara, Harish M. et al., "Design and Fabrication of a THz Nanoklystron" (www.sofia.usra.edu/det_workshop/posters/session 3/3-43manohara_poster.pdf), PowerPoint Presentation.

McDaniel, James C. et al., "Smith-Purcell Radiation in the High Conductivity and Plasma Frequency Limits," Applied Optics, Nov. 15, 1989, pp. 4924-4929, vol. 28 No. 22, Optical Society of America.

Meyer, Stephan, "Far IR, Sub-MM & MM Detector Technology Workshop Summary," Oct. 2002. (May date the Manohara documents).

Mokhoff, Nicolas, "Optical-speed light detector promises fast space talk," EETimes Online, Mar. 20, 2006, from website: www.eetimes.com/showArticle.jhtml?articleID=183701047.

Nguyen, Phucanh et al., "Novel technique to pattern silver using CF4 and CF4/O2 glow discharges," J.Vac. Sci. Technol. B 19(1), Jan./Feb. 2001, American Vacuum Society, pp. 158-165.

Nguyen, Phucanh et al., "Reactive ion etch of patterned and blanket silver thin films in C12/O2 and O2 glow discharges," J. Vac. Sci, Technol. B. 17(5), Sep./Oct. 1999, American Vacuum Society, pp. 2204-2209.

Ohtaka, Kazuo, "Smith-Purcell Radiation from Metallic and Dielectric Photonic Crystals," Center for Frontier Science, pp. 272-273, Chiba University, 1-33 Yayoi, Inage-ku, Chiba-shi, Japan.

Phototonics Research, "Surface-Plasmon-Enhanced Random Laser Demonstrated," Phototonics Spectra, Feb. 2005, pp. 112-113.

Platt, C.L. et al., "A New Resonator Design for Smith-Purcell Free Electron Lasers,"6Q19, page 296.

Potylitsin, A.P., "Resonant Diffraction Radiation and Smith-Purcell Effect," (Abstract), arXiv: physics/9803043 v2 Apr. 13, 1998.

Potylitsyn, A.P., "Resonant Diffraction Radiation and Smith-Purcell Effect," Physics Letters A, Feb. 2, 1998, pp. 112-116, A 238, Elsevier Science B.V.

S. Hoogland et al., "A solution-processed 1.53 μm quantum dot laser with temperature-invariant emission wavelength," Optics Express, vol. 14, No. 8, Apr. 17, 2006, pp. 3273-3281.

Savilov, Andrey V., "Stimulated Wave Scattering in the Smith-Purcell FEl," IEEE Transactions on Plasma Science, Oct. 2001, pp. 820-823, vol. 29 No. 5, IEEE.

Schachter, Levi et al., "Smith-Purcell Oscillator in an Exponential Gain Regime," Journal of Applied Physics, Apr. 15, 1989, pp. 3267-3269, vol. 65 No. 8, American Institute of Physics.

Schachter, Levi, "Influence of the Guiding Magnetic Field on the Performance of a Smith-Purcell Amplifier Operating in the Weak Compton Regime," Journal of the Optical Society of America, May 1990, pp. 873-876, vol. 7 No. 5, Optical Society of America.

Schachter, Levi "The Influence of the Guided Magnetic Field on the Performance of a Smith-Purcell Amplifier Operating in the Strong Compton Regime," Journal of Applied Physics, Apr. 15, 1990, pp. 3582-3592, vol. 67 No. 8, American Institue of Physics.

Shih, I. et al., "Experimental Investigations of Smith-Purcell Radiation," Journal of the Optical Society of America, Mar. 1990, pp. 351-356, vol. 7, No. 3, Optical Society of America.

Shih, I. et al., "Measurements of Smith-Purcell Radiation," Journal of the Optical Society of America, Mar. 1990, pp. 345-350, vol. 7 No. 3, Optical Society of America.

Swartz, J.C. et al., "THz-FIR Grating Coupled Radiation Source," Plasma Science, 1998. 1DO2, p. 126.

Temkin, Richard, "Scanning with Ease Through the Far Infrared," Science, New Series, May 8, 1998, p. 854, vol. 280, No. 5365, American Association for the Advancement of Science.

Walsh, J.E., et al., 1999. From website: http://www.ieee.org/organizations/pubs/newsletters/leos/feb99/hot2.htm.

Wentworth, Stuart M. et al., "Far-Infrared Composite Microbolometers," IEEE MTT-S Digest, 1990, pp. 1309-1310.

Yamamoto, N. et al., "Photon Emission From Silver Particles Induced by a High-Energy Electron Beam," Physical Review B, Nov. 6, 2001, pp. 205419-1-205419-9, vol. 64, The American Physical Society.

Yokoo, K. et al., "Smith-Purcell Radiation at Optical Wavelength Using a Field-Emitter Array," Technical Digest of IVMC, 2003, pp. 77-78.

Zeng, Yuxiao et al., "Processing and encapsulation of silver patterns by using reactive ion etch and ammonia anneal," Materials Chemistry and Physics 66, 2000, pp. 77-82.

Search Report and Written Opinion mailed Aug. 24, 2007 in PCT Appln. No. PCT/US2006/022768.

Search Report and Written Opinion mailed Aug. 31, 2007 in PCT Appln. No. PCT/US2006/022680.

Search Report and Written Opinion mailed Jul. 16, 2007 in PCT Appln. No. PCT/US2006/022774.

Search Report and Written Opinion mailed Jul. 20, 2007 in PCT Appln. No. PCT/US2006/024216.

Search Report and Written Opinion mailed Jul. 26, 2007 in PCT Appln. No. PCT/US2006/022776.

Search Report and Written Opinion mailed Jun. 20, 2007 in PCT Appln. No. PCT/US2006/022779.

Search Report and Written Opinion mailed Sep. 12, 2007 in PCT Appln. No. PCT/US2006/022767.

Search Report and Written Opinion mailed Sep. 13, 2007 in PCT Appln. No. PCT/US2006/024217.

Search Report and Written Opinion mailed Sep. 17, 2007 in PCT Appln. No. PCT/US2006/022787.

Search Report and Written Opinion mailed Sep. 5, 2007 in PCT Appln. No. PCT/US2006/027428.

Search Report and Written Opinion mailed Sep. 17, 2007 in PCT Appln. No. PCT/US2006/022689.

International Search Report and Written Opinion mailed Nov. 23, 2007 in International Application No. PCT/US2006/022786.

Search Report and Written Opinion mailed Oct. 25, 2007 in PCT Appln. No. PCT/US2006/022687.

Search Report and Written Opinion mailed Oct. 26, 2007 in PCT Appln. No. PCT/US2006/022675.

Search Report and Written Opinion mailed Sep. 21, 2007 in PCT Appln. No. PCT/US2006/022688.

Search Report and Written Opinion mailed Sep. 25, 2007 in PCT appln. No. PCT/US2006/022681.

Search Report and Written Opinion mailed Sep. 26, 2007 in PCT Appln. No. PCT/US2006/024218.

Search Report and Written Opinion mailed Apr. 23, 2008 in PCT Appln. No. PCT/US2006/022678.

Search Report and Written Opinion mailed Apr. 3, 2008 in PCT Appln. No. PCT/US2006/027429.

Search Report and Written Opinion mailed Jun. 18, 2008 in PCT Appln. No. PCT/US2006/027430.

Search Report and Written Opinion mailed Jun. 3, 2008 in PCT Appln. No. PCT/US2006/022783.

Search Report and Written Opinion mailed Mar. 24, 2008 in PCT Appln. No. PCT/US2006/022677.

Search Report and Written Opinion mailed Mar. 24, 2008 in PCT Appln. No. PCT/US2006/022784.
Search Report and Written Opinion mailed May 2, 2008 in PCT Appln. No. PCT/US2006/023280.
Search Report and Written Opinion mailed May 21, 2008 in PCT Appln. No. PCT/US2006/023279.
Search Report and Written Opinion mailed May 22, 2008 in PCT Appln. No. PCT/US2006/022685.
Search Report and Written Opinion mailed Jul. 16, 2008 in PCT Appln. No. PCT/US06/22766.
Neo et al., "Smith-Purcell Radiation from Ultraviolet to Infrared Using a Si-field Emitter" Vacuum Electronics Conference, 2007, IVEC ' 07, IEEE International May 2007.
Search Report and Writen Opinion mailed Jul. 14, 2008 in PCT Appln. No. PCT/US2006/022773.
Search Report and Written Opinion mailed Aug. 19, 2008 in PCT Appln. No. PCT/US2007/008363.
Search Report and Written Opinion mailed Jul. 28, 2008 in PCT Appln. No. PCT/US2006/022782.
Search Report and Written Opinion mailed Jul. 3, 2008 in PCT Appln. No. PCT/US2006/022690.
Search Report and Written Opinion mailed Jul. 3, 2008 in PCT Appln. No. PCT/US2006/022778.
Search Report and Written Opinion mailed Jul. 7, 2008 in PCT Appln. No. PCT/US2006/022686.
Search Report and Written Opinion mailed Jul. 7, 2008 in PCT Appln. No. PCT/US2006/022785.
Search Report and Written Opinion mailed Sep. 2, 2008 in PCT Appln. No. PCT/US2006/022769.
Search Report and Written Opinion mailed Sep. 26, 2008 in PCT Appln. No. PCT/US2007/00053.
Search Report and Written Opinion mailed Sep. 3, 2008 in PCT Appln. No. PCT/US2006/022770.
"An Early History - Invention of the Klystron," http://varianinc.com/cgi-bin/advprint/print.cgi?cid=KLQNPPJJFJ, printed on Dec. 26, 2008.
"An Early History - The Founding of Varian Associates," http://varianinc.com/cgi-bin/advprint/print.cgi?cid=KLQNPPJJFJ, printed on Dec. 26, 2008.
"Chapter 3 X-Ray Tube," http://compepid.tuskegee.edu/syllabi/clinical/small/radiology/chapter..., printed from tuskegee.edu on Dec. 29, 2008.
"Diagnostic imaging modalities - Ionizing vs non-ionizing radiation," http://info.med.yale.edu/intmed/cardio/imaging/techniques/ionizing_v..., printed from Yale University School of Medicine on Dec. 29, 2008.
"Frequently Asked Questions," Luxtera Inc., found at http://www.luxtera.com/technology_faq.htm, printed on Dec. 2, 2005, 4 pages.
"Klystron Amplifier," http://www.radartutorial.eu/08.transmitters/tx12.en.html, printed on Dec. 26, 2008.
"Klystron is a Microwave Generator," http://www2.slac.stanford.edu/vvc/accelerators/klystron.html, printed on Dec. 26, 2008.
"Klystron," http:en.wikipedia.org/wiki/Klystron, printed on Dec. 26, 2008.
"Making X-rays," http://www.fnrfscience.cmu.ac.th/theory/radiation/xray-basics.html, printed on Dec. 29, 2008.
"Microwave Tubes," http://www.tpub.com/neets/book11/45b.htm, printed on Dec. 26, 2008.
"Notice of Allowability" mailed on Jan. 17, 2008 in U.S. Appl. No. 11/418,082 filed May 5, 2006.
"Technology Overview," Luxtera, Inc., found at http://www.luxtera.com/techology.htm, printed on Dec. 2, 2005, 1 page.
"The Reflex Klystron," http://www.fnrfscience.cmu.ac.th/theory/microwave/microwave%2, printed from Fast Netoron Research Facilty on Dec. 26, 2008.
"x-ray tube," http://www.answers.com/topic/x-ray-tube, printed on Dec. 29, 2008.
Mar. 24, 2006 PTO Office Action in U.S. Appl. No. 10/917,511.
Mar. 25, 2008 PTO Office Action in U.S. Appl. No. 11/411,131.
Apr. 8, 2008 PTO Office Action in U.S. Appl. No. 11/325,571.
Apr. 17, 2008 Response to PTO Office Action of Dec. 20, 2007 in U.S. Appl. No. 11/418,087.
Apr. 19, 2007 Response to PTO Office Action of Jan. 17, 2007 in U.S. Appl. No. 11/418,082.
May 10, 2005 PTO Office Action in U.S. Appl. No. 10/917,511.
May 21, 2007 PTO Office Action in U.S. Appl. No. 11/418,087.
May 26, 2006 Response to PTO Office Action of Mar. 24, 2006 in U.S. Appl. No. 10/917,511.
Jun. 16, 2008 Response to PTO Office Action of Dec. 14, 2007 in U.S. Appl. No. 11/418,264.
Jun. 20, 2008 Response to PTO Office Action of Mar. 25, 2008 in U.S. Appl. No. 11/411,131.
Aug. 14, 2006 PTO Office Action in U.S. Appl. No. 10/917,511.
Sep. 1, 2006 Response to PTO Office Action of Aug. 14, 2006 in U.S. Appl. No. 10/917,511.
Sep. 12, 2005 Response to PTO Office Action of May 10, 2005 in U.S. Appl. No. 10/917,511.
Sep. 14, 2007 PTO Office Action in U.S. Appl. No. 11/411,131.
Oct. 19, 2007 Response to PTO Office Action of May 21, 2007 in U.S. Appl. No. 11/418,087.
Dec. 4, 2006 PTO Office Action in U.S. Appl. No. 11/418,087.
Dec. 14, 2007 PTO Office Action in U.S. Appl. No. 11/418,264.
Dec. 14, 2007 Response to PTO Office Action of Sep. 14, 2007 in U.S. Appl. No. 11/411,131.
Dec. 20, 2007 PTO Office Action in U.S. Appl. No. 11/418,087.
Corcoran, Elizabeth, "Ride the Light," Forbes Magazine, Apr. 11, 2005, pp. 68-70.
European Search Report mailed Mar. 3, 2009 in European Application No. 06852028.7.
Ossia, Babak, "The X-Ray Production," Department of Biomedical Engineering - University of Rhode Island, 1 page.
Sadwick, Larry et al., "Microfabricated next-generation millimeter-wave power amplifiers," www.rfdesign.com.
Saraph, Girish P. et al., "Design of a Single-Stage Depressed Collector for High-Power, Pulsed Gyroklystrom Amplifiers," IEEE Transactions on Electron Devices, vol. 45, No. 4, Apr. 1998, pp. 986-990.
Sartori, Gabriele, "CMOS Photonics Platform," Luxtera, Inc., Nov. 2005, 19 pages.
Thumm, Manfred, "Historical German Contributions to Physics and Applications of Electromagnetic Oscillations and Waves."
U.S. Appl. No. 11/203,407 - Nov. 13, 2008 PTO Office Action.
U.S. Appl. No. 11/238,991 - Dec. 6, 2006 PTO Office Action.
U.S. Appl. No. 11/238,991 - Jun. 6, 2007 Response to PTO Office Action of Dec. 6, 2006.
U.S. Appl. No. 11/238,991 - Sep. 10, 2007 PTO Office Action.
U.S. Appl. No. 11/238,991 - Mar. 6, 2008 Response to PTO Office Action of Sep. 10, 2007.
U.S. Appl. No. 11/238,991 - Jun. 27, 2008 PTO Office Action.
U.S. Appl. No. 11/238,991 - Dec. 29, 2008 Response to PTO Office Action of Jun. 27, 2008.
U.S. Appl. No. 11/238,991 - Mar. 24, 2009 PTO Office Action.
U.S. Appl. No. 11/243,477 - Apr. 25, 2008 PTO Office Action.
U.S. Appl. No. 11/243,477 - Oct . 24, 2008 Response to PTO Office Action of Apr. 25, 2008.
U.S. Appl. No. 11/243,477 - Jan. 7, 2009 PTO Office Action.
U.S. Appl. No. 11/325,448 - Jun. 16, 2008 PTO Office Action.
U.S. Appl. No. 11/325,448 - Dec. 16, 2008 Response to PTO Office Action of Jun. 16, 2008.
U.S. Appl. No. 11/325,534 - Jun. 11, 2008 PTO Office Action.
U.S. Appl. No. 11/325,534 - Oct. 15, 2008 Response to PTO Office Action of Jun. 11, 2008.
U.S. Appl. No. 11/353,208 - Jan. 15, 2008 PTO Office Action.
U.S. Appl. No. 11/353,208 - Mar. 17, 2008 PTO Office Action.
U.S. Appl. No. 11/353,208 - Sep.15, 2008 Response to PTO Office Action of Mar. 17, 2008.
U.S. Appl. No. 11/353,208 - Dec. 24, 2008 PTO Office Action.
U.S. Appl. No. 11/353,208 - Dec. 30, 2008 Response to PTO Office Action. of Dec. 24, 2008.
U.S. Appl. No. 11/400,280 - Oct. 16, 2008 PTO Office Action.
U.S. Appl. No. 11/400,280 - Oct. 24, 2008 Response to PTO Office Action of Oct. 16, 2008.
U.S. Appl. No. 11/410,905 - Sep. 26, 2008 PTO Office Action.
U.S. Appl. No. 11/410,905 - Mar. 26, 2009 Response to PTO Office Action of Sep. 26, 2008.
U.S. Appl. No. 11/410,924 - Mar. 6, 2009 PTO Office Action.

U.S. Appl. No. 11/411,120 - Mar. 19, 2009 PTO Office Action.
U.S. Appl. No. 11/411,129 - Jan. 16, 2009 Office Action.
U.S. Appl. No. 11/411,130 - May 1, 2008 PTO Office Action.
U.S. Appl. No. 11/411,130 - Oct. 29, 2008 Response to PTO Office Action of May 1, 2008.
U.S. Appl. No. 11/417,129 - Jul. 11, 2007 PTO Office Action.
U.S. Appl. No. 11/417,129 - Dec. 17, 2007 Response to PTO Office Action of Jul. 11, 2007.
U.S. Appl. No. 11/417,129 - Dec. 20, 2007 Response to PTO Office Action of Jul. 11, 2007.
U.S. Appl. No. 11/417,129 - Apr. 17, 2008 PTO Office Action.
U.S. Appl. No. 11/417,129 - Jun. 19, 2008 Response to PTO Office Action of Apr. 17, 2008.
U.S. Appl. No. 11/418,079 - Apr. 11, 2008 PTO Office Action.
U.S. Appl. No. 11/418,079 - Oct. 7, 2008 Response to PTO Office Action of Apr. 11, 2008.
U.S. Appl. No. 11/418,079 - Feb. 12, 2009 PTO Office Action.
U.S. Appl. No. 11/418,080 - Mar. 18, 2008 PTO Office Action.
U.S. Appl. No. 11/418,082 - Jan. 17, 2007 PTO Office Action.
U.S. Appl. No. 11/418,083 - Jun. 20, 2008-2008 PTO Office Action.
U.S. Appl. No. 11/418,083 - Dec. 18, 2008 Response to PTO Office Action of Jun. 20, 2008.
U.S. Appl. No. 11/418,084 - Nov. 5, 2007 PTO Office Action.
U.S. Appl. No. 11/418,084 - May 5, 2008 Response to PTO Office Action of Nov. 5, 2007.
U.S. Appl. No. 11/418,084 - Aug. 19, 2008 PTO Office Action.
U.S. Appl. No. 11/418,084 - Feb. 19, 2009 Response to PTO Office Action of Aug. 19, 2008.
U.S. Appl. No. 11/418,085 - Aug. 10, 2007 PTO Office Action.
U.S. Appl. No. 11/418,085 - Nov. 13, 2007 Response to PTO Office Action of Aug. 10, 2007.
U.S. Appl. No. 11/418,085 - Feb. 12, 2008 PTO Office Action.
U.S. Appl. No. 11/418,085 - Aug. 12, 2008 Response to PTO Office Action of Feb. 12, 2008.
U.S. Appl. No. 11/418,085 - Sep. 16, 2008 PTO Office Action.
U.S. Appl. No. 11/418,085 - Mar. 6, 2008 Response to PTO Office Action of Sep. 16, 2008.
U.S. Appl. No. 11/418,087 - Dec. 29, 2006 Response to PTO Office Action of Dec. 4, 2006.
U.S. Appl. No. 11/418,087 - Feb. 15, 2007 PTO Office Action.
U.S. Appl. No. 11/418,087 - Mar. 6, 2007 Response to PTO Office Action of Feb. 15, 2007.
U.S. Appl. No. 11/418,089 - Mar. 21, 2008 PTO Office Action.
U.S. Appl. No. 11/418,089 - Jun. 23, 2008 Response to PTO Office Action of Mar. 21, 2008.
U.S. Appl. No. 11/418,089 - Sep. 30, 2008 PTO Office Action.
U.S. Appl. No. 11/418,089 - Mar. 30, 2009 Response to PTO Office Action of Sep. 30, 2008.
U.S. Appl. No. 11/418,091 - Jul. 30, 2007 PTO Office Action.
U.S. Appl. No. 11/418,091 - Nov. 27, 2007 Response to PTO Office Action of Jul. 30, 2007.
U.S. Appl. No. 11/418,091 - Feb. 26, 2008 PTO Office Action.
U.S. Appl. No. 11/418,097 - Jun. 2, 2008 PTO Office Action.
U.S. Appl. No. 11/418,097 - Dec. 2, 2008 Response to PTO Office Action of Jun. 2, 2008.
U.S. Appl. No. 11/418,097 - Feb. 18, 2009 PTO Office Action.
U.S. Appl. No. 11/418,099 - Jun. 23, 2008 PTO Office Action.
U.S. Appl. No. 11/418,099 - Dec. 23, 2008 Response to PTO Office Action of Jun. 23, 2008.
U.S. Appl. No. 11/418,100 - Jan. 12, 2009 PTO Office Action.
U.S. Appl. No. 11/418,123 - Apr. 25, 2008 PTO Office Action.
U.S. Appl. No. 11/418,123 - Oct. 27, 2008 Response to PTO Office Action of Apr. 25, 2008.
U.S. Appl. No. 11/418,123 - Jan. 26, 2009 PTO Office Action.
U.S. Appl. No. 11/418,124 - Oct. 1, 2008 PTO Office Action.
U.S. Appl. No. 11/418,124 - Feb. 2, 2009 Response to PTO Office Action of Oct. 1, 2008.
U.S. Appl. No. 11/418,124 - Mar. 13, 2009 PTO Office Action.
U.S. Appl. No. 11/418,126 - Oct. 10, 2006 PTO Office Action.
U.S. Appl. No. 11/418,126 - Feb. 12, 2007 Response to PTO Office Action of Oct. 12, 2006 (Redacted).
U.S. Appl. No. 11/418,126 - Jun. 6, 2007 PTO Office Action.
U.S. Appl. No. 11/418,126 - Aug. 6, 2007 Response to PTO Office Action of Jun. 6, 2007.
U.S. Appl. No. 11/418,126 - Nov. 2, 2007 PTO Office Action.
U.S. Appl. No. 11/418,126 - Feb. 22, 2008 Response to PTO Office Action of Nov. 2, 2007.
U.S. Appl. No. 11/418,126 - Jun. 10, 2008 PTO Office Action.
U.S. Appl. No. 11/418,127 - Apr. 2, 2009 Office Action.
U.S. Appl. No. 11/418,128 - Dec. 16, 2008 PTO Office Action.
U.S. Appl. No. 11/418,128 - Dec. 31, 2008 Response to PTO Office Action of Dec. 16, 2008.
U.S. Appl. No. 11/418,128 - Feb. 17, 2009 PTO Office Action.
U.S. Appl. No. 11/418,129 - Dec. 16, 2008 Office Action.
U.S. Appl. No. 11/418,129 - Dec. 31, 2008 Response to PTO Office Action of Dec. 16, 2008.
U.S. Appl. No. 11/418,244 - Jul. 1, 2008 PTO Office Action.
U.S. Appl. No. 11/418,244 - Nov. 25, 2008 Response to PTO Office Action of Jul. 1, 2008.
U.S. Appl. No. 11/418,263 - Sep. 24, 2008 PTO Office Action.
U.S. Appl. No. 11/418,263 - Dec. 24, 2008 Response to PTO Office Action of Sep. 24, 2008.
U.S. Appl. No. 11/418,263 - Mar. 9, 2009 PTO Office Action.
U.S. Appl. No. 11/418,315 - Mar. 31, 2008 PTO Office Action.
U.S. Appl. No. 11/418,318 - Mar. 31, 2009 PTO Office Action.
U.S. Appl. No. 11/441,219 - Jan. 7, 2009 PTO Office Action.
U.S. Appl. No. 11/522,929 - Oct. 22, 2007 PTO Office Action.
U.S. Appl. No. 11/522,929 - Feb. 21, 2008 Response to PTO Office Action of Oct. 22, 2007.
U.S. Appl. No. 11/641,678 - Jul. 22, 2008 PTO Office Action.
U.S. Appl. No. 11/641,678 - Jan. 22, 2009 Response to Office Action of Jul. 22, 2008.
U.S. Appl. No. 11/711,000 - Mar. 6, 2009 PTO Office Action.
U.S. Appl. No. 11/716,552 - Feb. 12, 2009 Response to PTO Office Action of Feb. 9, 2009.
U.S. Appl. No. 11/716,552 - Jul. 3, 2008 PTO Office Action.
Whiteside, Andy et al., "Dramatic Power Savings using Depressed Collector IOT Transmitters in Digital and Analog Service."

* cited by examiner

HETERODYNE RECEIVER USING RESONANT STRUCTURES

COPYRIGHT NOTICE

A portion of the disclosure of this patent document contains material which is subject to copyright or mask work protection. The copyright or mask work owner has no objection to the facsimile reproduction by anyone of the patent document or the patent disclosure, as it appears in the patent and Trademark Office patent file or records, but otherwise reserves all copyright or mask work right whatsoever.

CROSS-REFERENCE TO RELATED APPLICATIONS

The present invention is related to the following co-pending U.S. Patent applications which are all commonly owned with the present application, the entire contents of each of which are incorporated herein by reference:
1. U.S. patent application Ser. No. 11/238,991, entitled "Ultra-Small Resonating Charged Particle Beam Modulator," filed Sep. 30, 2005;
2. U.S. patent application Ser. No. 10/917,511, entitled "Patterning Thin Metal Film by Dry Reactive Ion Etching," filed on Aug. 13, 2004;
3. U.S. application Ser. No. 11/203,407, entitled "Method Of Patterning Ultra-Small Structures," filed on Aug. 15, 2005;
4. U.S. application Ser. No. 11/243,476, entitled "Structures And Methods For Coupling Energy From An Electromagnetic Wave," filed on Oct. 5, 2005;
5. U.S. application Ser. No. 11/243,477, entitled "Electron beam induced resonance," filed on Oct. 5, 2005;
6. U.S. application Ser. No. 11/325,448, entitled "Selectable Frequency Light Emitter from Single Metal Layer," filed Jan. 5, 2006;
7. U.S. application Ser. No. 11/325,432, entitled, "Matrix Array Display," filed Jan. 5, 2006;
8. U.S. application Ser. No. 11/302,471, entitled "Coupled Nano-Resonating Energy Emitting Structures," filed Dec. 14, 2005;
9. U.S. application Ser. No. 11/325,571, entitled "Switching Micro-resonant Structures by Modulating a Beam of Charged Particles," filed Jan. 5, 2006;
10. U.S. application Ser. No. 11/325,534, entitled "Switching Microresonant Structures Using at Least One Director," filed Jan. 5, 2006;
11. U.S. application Ser. No. 11/350,812, entitled "Conductive Polymers for Electroplating," filed Feb. 10, 2006;
12. U.S. application Ser. No. 11/349,963, entitled "Method and Structure for Coupling Two Microcircuits," filed Feb. 9, 2006;
13. U.S. application Ser. No. 11/353,208, entitled "Electron Beam Induced Resonance," filed Feb. 14, 2006;
14. U.S. application Ser. No. 11/400,280, entitled "Resonant Detectors for Optical Signals," filed Apr. 10, 2006 (Attorney Docket No. 2549-0068);
15. U.S. application Ser. No. 11/410,924, entitled "Selectable Frequency EMR Emitter," filed Apr. 26, 2006 (Attorney Docket No. 2549-0010); and
16. U.S. application Ser. No. 11/411,129, entitled "Micro Free Electron Laser (FEL)," filed Apr. 26, 2006 (Attorney Docket No. 2549-0005).

FIELD OF THE DISCLOSURE

This relates in general to receivers for detecting electromagnetic signals and in particular to resonant structures detecting encoded electromagnetic signals in the present of a local oscillator.

INTRODUCTION

It is not a simple task to modulate a light beam into an electron beam. Due to the size and dispersion of photons in the light beam and the size and dispersion of electrons in the electron beam the two rarely intersect, physically, even when the light beam and electron beam are directly crossed. There have been some physicists who have employed large scale lasers to intersect an electron beam and detected occasional scattered electron patterns caused by a few of the electrons in the beam physically intersecting with photons in the laser beam. But, the scale of such devices is large and their efficiency is poor.

In the related applications described above, micro- and nano-resonant structures are described that react in now-predictable manners when an electron beam is passed in their proximity. We have seen, for example, that the very small structures described in those applications allow energy of the electron beam to be converted into the energy of electromagnetic radiation (light) when the electron beam passes nearby. When the electron beam passes near the structure, it excites synchronized oscillations of the electrons in the structure (surface plasmons) and/or electrons in the beam. As often repeated as the many electrons in a beam pass, these surface plasmons result in reemission of detectable photons as electromagnetic radiation (EMR).

As would be appreciated by those of skill in the art, an information signal to be transmitted may be encoded on or mixed with a carrier signal prior to transmission. The mixed signal can then transport the information signal at an extremely fast data rate. Further, using resonant structures of the types described in the related applications, the transmitter can be built into a chip and used to transmit the data within a microcircuit (intra-chip) or between one or more microcircuits of one or more chips. A number of methods of encoding such data can be envisioned and is not delimiting of the inventions described herein.

We herein disclose methods and structures for receiving the encoded EMR, and decoding it to retrieve the original data. In one embodiment described herein, a receiver utilizes heterodyne mixing techniques and a local source of electromagnetic radiation (EMR) to extract an original information signal which was encoded on a carrier signal.

THE PRESENTLY PREFERRED EXEMPLARY EMBODIMENTS

A transmitter 1 can include an ultra-small resonant structure, such as any one described in U.S. patent application Ser. Nos. 11/238,991; 11/243,476; 11/243,477; 11/325,448; 11/325,432; 11/302,471; 11/325,571; 11/325,534; 11/349,963; and/or 11/353,208 (each of which is identified more particularly above). The resonant structures in the transmitter can be manufactured in accordance with any of U.S. application Ser. Nos. 10/917,511; 11/350,812; or 11/203,407 (each of which is identified more particularly above) or in other ways. Their sizes and dimensions can be selected in accordance with the principles described in those applications and, for the sake of brevity, will not be repeated herein. The contents of the applications described above are assumed to be known to the reader.

Although less advantageous than the ultra-small resonant structures identified in the applications described above, alternatively the transmitter 1 can also comprise any macroscopic or microscopic light emitter, and can include even prior art LEDs, semiconductors or other light-emitting devices.

Figure 1:
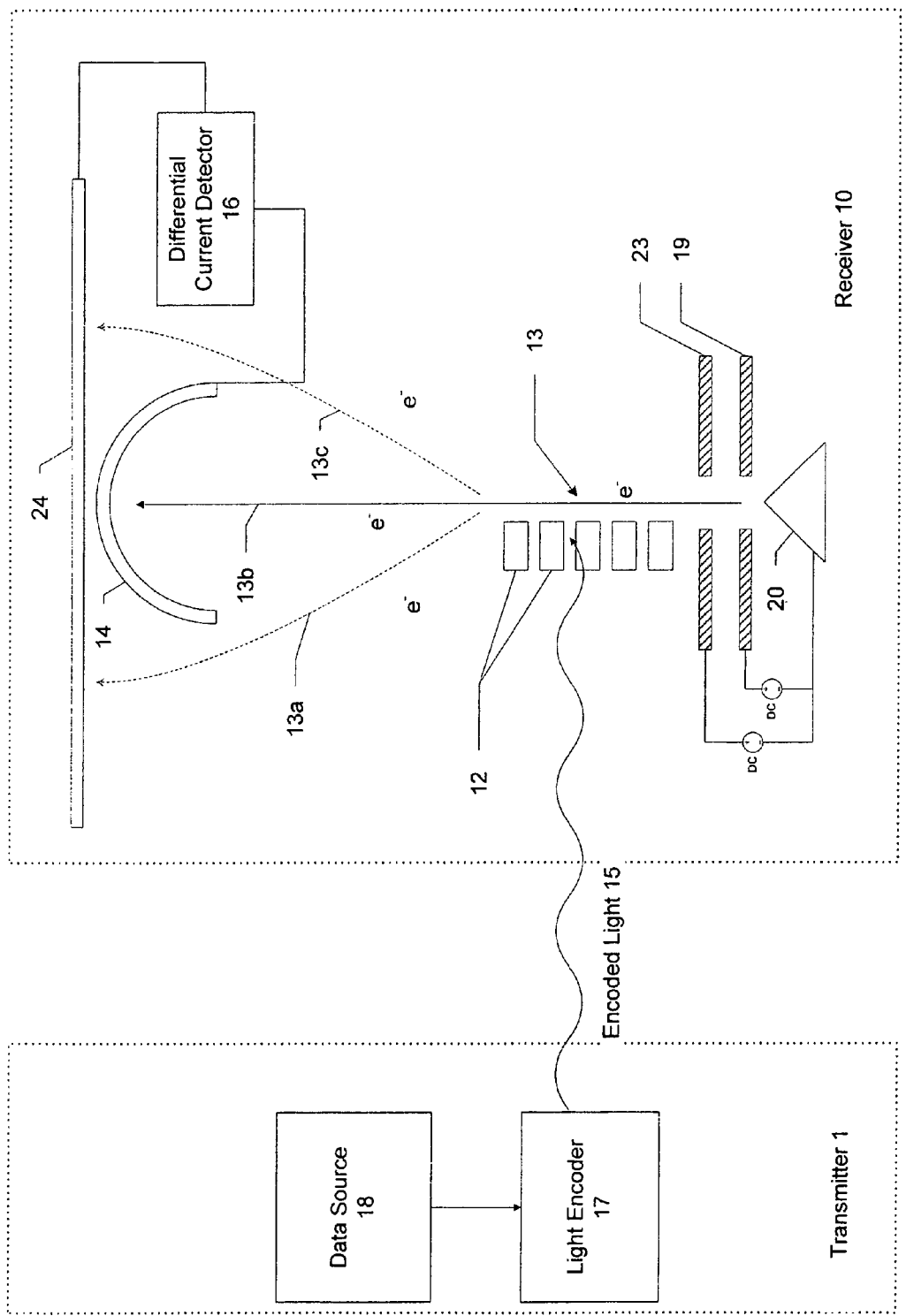
FIG. 1 is a schematic view of an encoder and decoder system.

The transmitter 1 is operated in association with a data source 18, which may be part of the transmitter or may be separated from the transmitter 1 (the former embodiment is shown in FIG. 1). For purposes of this disclosure, the kind of data transmitted, the kind of EMR produced, and the kind of structure producing the EMR are not delimiting. It matters only that in some way data are encoded into an EMR beam. In the embodiment of FIG. 1, the data source 18 supplies data to a light encoder 17 that encodes the data into the light beam and transmits encoded light 15 to the receiver 10.

In the example of FIG. 1, the receiver 10 includes cathode 20, anode 19, optional energy anode 23, ultra-small resonant structures 12, Faraday cup or other receiving electrode 14, electrode 24, and differential current detector 16. The status of the receiver 10 will now be described in the case where the receiver 10 is not being stimulated by encoded light 15. In such a case, the cathode 20 produces an electron beam 13, which is steered and focused by anode 19 and accelerated by energy anode 23. The electron beam 13 is directed to pass close to but not touching one or more ultra-small resonant structures 12. In this sense, the beam needs to be only proximate enough to the ultra-small resonant structures 12 to invoke detectable electron beam modifications, as will be described in greater detail below. These resonant structures in the receiver 10 can be, by way of example, one of those described in U.S. patent application Ser. Nos. 11/238,991; 11/243,476; 11/243,477; 11/325,448; 11/325,432; 11/302,471; 11/325,571; 11/325,534; 11/349,963; and/or 11/353,208 (each of which is identified more particularly above). The resonant structures in the receiver 10 can be manufactured in accordance with any of U.S. application Ser. Nos. 10/917,511; 11/350,812; or 11/203,407 (each of which is identified more particularly above) or in other ways.

As the term is used herein, the structures are considered ultra-small when they embody at least one dimension that is smaller than the wavelength of visible light. The ultra-small structures are employed in a vacuum environment. Methods of evacuating the environment where the beam 13 passes by the structures 12 can be selected from known evacuation methods.

After the anode 19, the electron beam 13 passes energy anode 23, which further accelerates the electrons in known fashion. When the resonant structures 12 are not receiving the encoded light 15, then the electron beam 13 passes by the resonant structures 12 with the structures 12 having no significant effect on the path of the electron beam 13. The electron beam 13 thus follows, in general, the path 13b. In the embodiment of FIG. 1, the electron beam 13 proceeds past the structures 12 and is received by a Faraday cup or other detector electrode 14. As is well-known, the Faraday cup will receive and absorb the electron beam 13. In alternative embodiments, the path of the electron beam can be altered even when the encoded light 15 is not being received at the resonant structures, provided the path of the electron beam 13 is identifiable with the absence of the encoded light 15.

Next, we describe the situation when the encoded light 15 is induced on the resonant structures 12. Like the earlier scenario, the cathode 20 produces the electron beam 13, which is directed by the current anode 19 and energy anode 23, past the resonant structures 12. In this case, however, the encoded light 15 is inducing surface plasmons to resonate on the resonant structures 12. The ability of the encoded light 15 to induce the surface plasmons is described in one or more of the above applications and is not repeated herein. The electron beam 13 is impacted by the surface plasmon effect causing the electron beam to steer away from path 13b (into the Faraday cup) and into alternative path 13a or 13c. Note that the dimensions in FIG. 1 are not to scale—the amount of deflection of the electron beam may be exaggerated in FIG. 1 to illustrate the principle. The size of the Faraday cup or other detector electrode 14 is selected so the deflected electron beam on path 13a/13b misses the Faraday cup and instead is received at the electrode 24. Differential current detector 16 detects when the electron beam 13 is impacting the electrode 24 by detecting a differential current between the Faraday cup or other detector electrode 14 and the electrode 24. Alternative methods of detecting the deflected electron beam other than the Faraday cup and electrode will be recognizable to the artisan who understands from this description the structure and purpose of the receiver 10.

Figure 2:
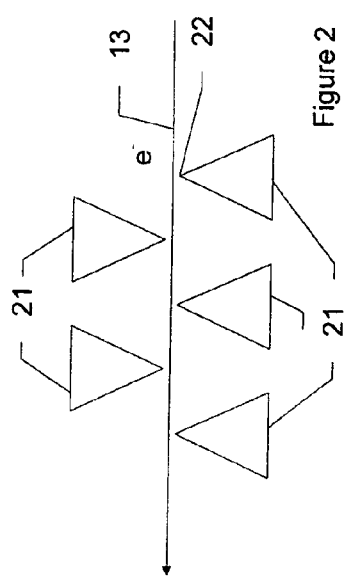
FIG. 2 is an alternative resonant structure for a receiver.

Many alternative structures and arrangements are available for the various components shown in FIG. 1. For example, resonant structures 12 can appear on one side of the electron beam 13, as shown, or may appear on both sides of the electron beam 13 so the electron beam path is impacted by resonant structures as it passes between them. An example such structure is shown in FIG. 2. There, the resonant structures are no longer rectangular shaped (the structures could conceivably be any shape), but are instead triangular. The triangular shape may be preferable in altering the passing electron beam 13 due to concentration of the electromagnetic fields in the tips of the triangles as the surface plasmons are excited by the incident light 15.

As is generally known, the encoded light 15 will not interact with the electron beam directly. That is, the electrons in the beam are so small and so dispersed and the photons of the light 15 are small and dispersed that practical interaction between them is essentially a statistical non-existence. The general belief is that direct transfer of the information in the encoded light 15 with the highly dispersed electron beam is impractical if not impossible. Although the encoded light 15 cannot be reliably transferred to the electronic structures of the receiver 10 by simple interaction of the light 15 with the electron beam 13, we have provided a receiver that "holds" the information in the light on the resonant structures 12 via the activity of the surface plasmons long enough for the electron beam 13 passing by to interact with light 15 and couple the data content. The information encoded in the light 15 is thus coupled onto the electron beam 13 (and thus to electronic circuit elements) when it was previously considered impossible to do so.

The light 15 can be encoded with the data from the data source 18 in a variety of ways, but one example way is now described. The light 15 can be encoded by pulses, such that a light "OFF" condition indicates a binary "0" bit condition from the data source 18 and a light "ON" condition indicates a binary "1" bit condition from the data source 18. The encoded light 15 sent to the receiver is then a set of pulses indicating binary data information. The response of the receiver resonant structures 21 is illustrated in FIGS. 3 and 4.

Figure 4:
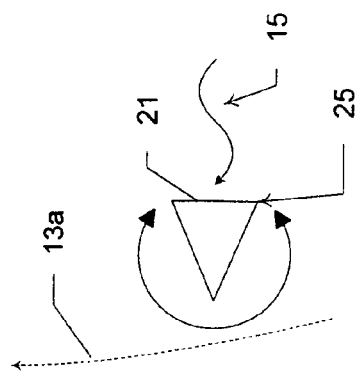
FIGS. 3 and 4 are schematic representations of a portion of a resonant structure decoding binary "LO" and binary "HI" signals, respectively.
Figure 3:
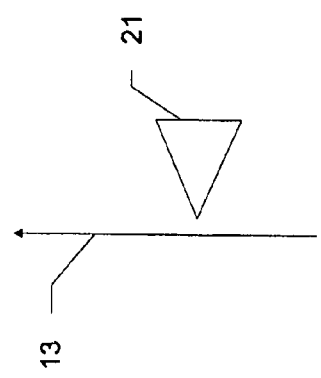

In FIGS. 3 and 4, for simplicity we illustrate only one of the resonant structures 21, but the artisan will recognize from the disclosure with respect to FIGS. 1 and 2 that more than one such structure can be presented in the receiver 10. FIG. 3 illustrates the electron beam 13 passing by the resonant structure 21 when the encoded light 15 is "OFF," i.e., a "0" binary bit condition from the data source 18. As shown, the lack of incident light from the encoded light beam 15 (an "off pulse") produces no appreciable effect between the resonant structure 21 and the passing electron beam 13. Accordingly, the electron beam 13 passing generally straight along path 13b and into the Faraday cup or other detector electrode 14.

FIG. 4 illustrates the electron beam 13 passing by the resonant structure 21 when the encoded light 15 is "ON," i.e., a "1" binary bit condition from the data source 18. In this case, the light 15 is incident to the resonant structure 21. The resonant structure 21 responds to the light 15 with the surface plasmons moving on the surface 25 and creating a focused electric field at the tip of the triangular structure 21. The electric field causes the passing electron 13 to alter its otherwise straight path to the alternative path 13a. As described earlier, the path 13a takes the electron beam past the Faraday cup or other detector electrode 14 and onto the electrode 24, where the electron beam is detected by the differential current detector 16. Alternatively to directing the electron beam to one of the paths 13a or 13c, the path of the deflected electron beam 13 could be a scattering along multiple paths including paths 13a and 13c, as the resonating effect of the light 15 on the structures 21 changes the electric field at the tip. In such a case, using the embodiment of FIG. 1, the altered paths will each miss the detector 14 and thus the resonance on the structure 21 will still cause the electrons to meet the electrode 24 rather than the electrode 14.

As described, the "ON" condition of the light 15 is reflected in a detection of a current difference in the differential current detector 16 caused by the deflection of the electron beam 13 into the electrode 24 rather than the detector electrode 14. A pulse "OFF" condition of the light 15 is reflected in a detection of a different differential current value in the differential current detector 16 when the electron beam 13 is directed straight into the Faraday cup or other detector electrode 14.

Recognizing now how the receiver 10 can decode the "0" and "1" conditions, the artisan can readily appreciate how the encoder 17 can encode the data from the data source 18 by pulsing the light on for one of the binary conditions and off for the other of the binary conditions.

Figure 5:
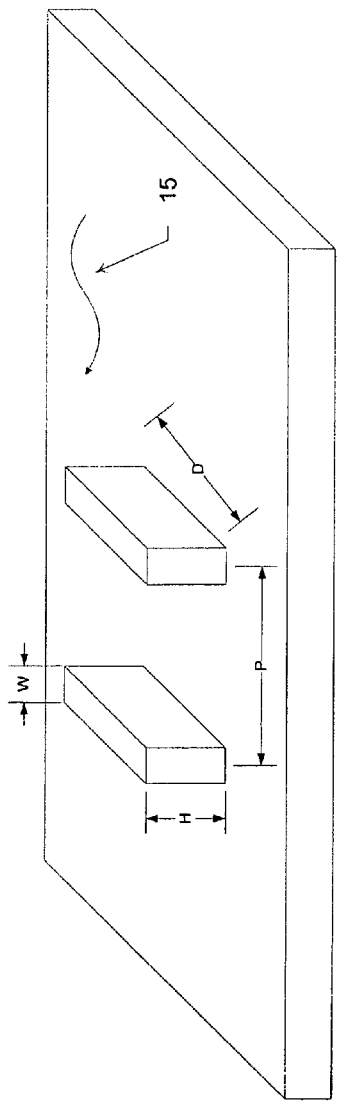
FIG. 5 is a perspective view of two resonant structures for a receiver.
Figure 6:
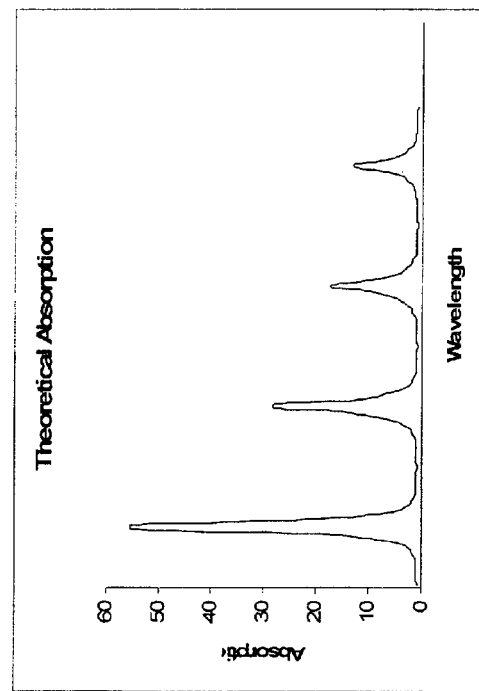
FIG. 6 is a non-empirical, non-experimental representation of the theoretical absorption versus wavelength for a structure such as in FIG. 5.

In general, a resonant structure 12 and/or 21 will respond most effectively to a particular frequency of light. In a preferred arrangement, the transmitter transmits light at a particular wavelength and the resonant structures 12 and 21 have geometries that respond to that wavelength. FIG. 6 illustrates the general principle (it is not reflective of any actual test) that ultra-small structures of particular geometries, such as those shown in FIG. 5 (showing height, width, depth and periodicity of resonant structures) will demonstrate absorption rates peaking at multiples of a particular wavelength. Those absorption rates will correlate to the strength of the electric fields produced at the points of the triangle resonant structures 21 or other-shaped structures 12, and thus will correlate to the effect that the light 15 has on the passing electron beam 13. The present receiver 10 is not limited to any particular resonant structure shape (many example shapes are described in the related patent applications identified above), but should preferably (though not necessarily) have one dimension smaller than the wavelength of the photon to be produced.

For any given structure, the wavelength characteristics shown in FIG. 6 can be ascertained for any given structure by empirically testing the structure. Applying light of varying frequencies and measuring the absorption characteristics leads to a kind of the graph of FIG. 6 for any particular structure type, size, and periodicity. Once the characteristic frequency of absorption is ascertained, it can either be adjusted to the frequency of the encoded light 15, or the encoded light 15 can be adjusted in frequency to that of the receiver 10. An estimate of the frequency response can be calculated as well.

Figure 18:
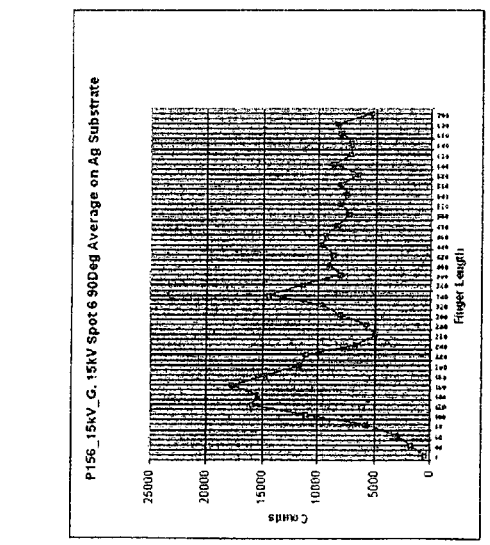
FIG. 18 is a representation of experimental results from a resonant receiver structure.

One example empirical graph is shown in FIG. 18 where the Y-axis represents counts of electrons detected versus finger length (i.e., the long dimension of resonant structure. The resultant peaks illustrate optimal finger lengths for the particular light frequency and can be used to shape the geometry of the resonant structures to optimally couple the light beam 15.

Figure 7:
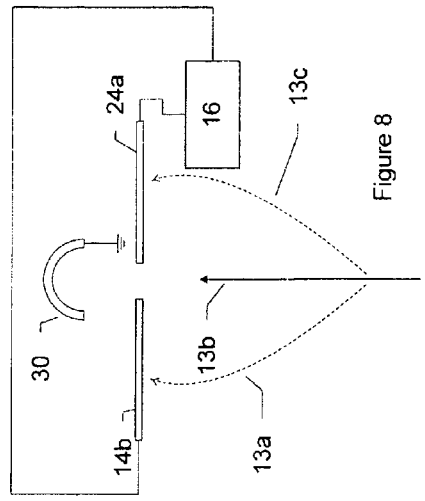
FIG. 7 is an alternative example receiver.

FIGS. 7-13 illustrate different forms of receivers that provide the same mechanism of decoding of the encoded light 15. In FIG. 7, the electrode 14a corresponds to the electrode 14 in FIG. 1, except that the shape is flatter. FIG. 7 illustrates the broader principle that the shape, size and characteristics of all of the electrodes shown can be modified from the ones described and shown herein and still accomplish the intended decoding.

Figure 8:
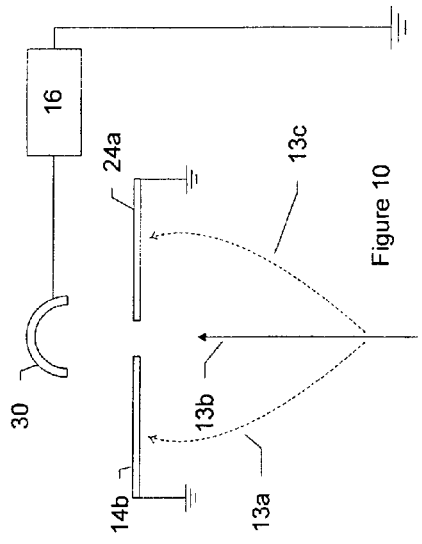
FIG. 8 is an alternative example receiver.

In FIG. 8, two additional alternative design principles are embodied. First, the order of encounter of the electrodes can be altered; namely the "straight path" electrode 30 for the OFF condition can appear to the electron beam 13 after passing the "altered path" electrode 14b/24a for the ON condition. In this embodiment, the electrodes 14b and 24a can be separate electrodes electrically connected to the detector 16, or they can be one doughnut-shaped electrode with the hole in the center providing the path for the electron beam 13 to pass when it is not be diverted. FIG. 8 also illustrates the alternative principle that the detector 16 need not detect the current difference between the ON and OFF electrodes, but can instead detect change in current in the ON electrode(s). In that instance, the OFF electrode (in the case of FIG. 8 the electrode 30) takes the electron beam to ground (or may capture it with a Faraday cup and employ it for power requirements of the electric circuits).

Figure 9:
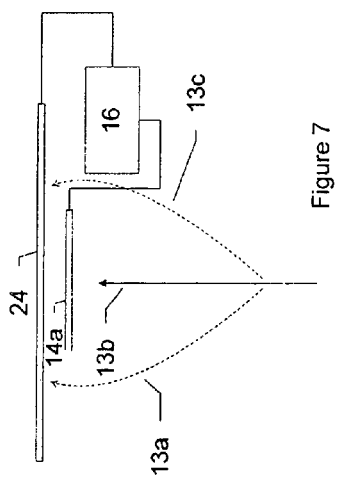
FIG. 9 is an alternative example receiver.

FIG. 9 illustrates a detector in which the detector 16 detects current conditions on the OFF electrode 14c and compares it to ground. It could alternatively do the same for the ON electrode (instead or in addition to the OFF electrode).

Figure 10:
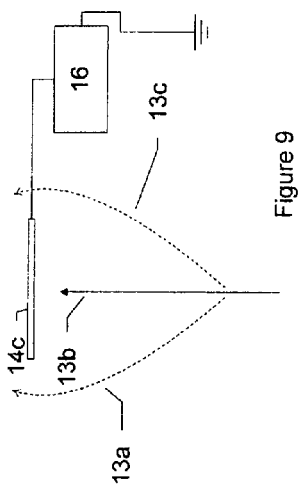
FIG. 10 is an alternative example receiver.

FIG. 10 illustrates the ON electrodes 14b/24a taking the electron beam to ground and the OFF electrode 30 providing the detector 16 with a signal referenced to ground whenever the electron beam follows the non-deflected path 13b.

Figure 11:
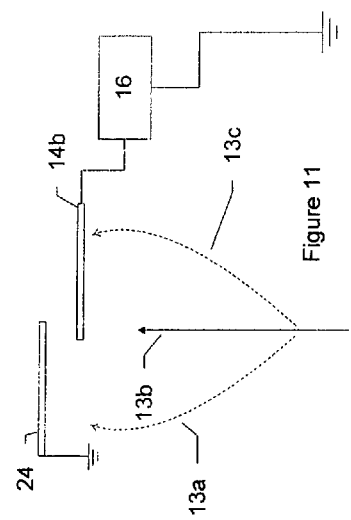
FIG. 11 is an alternative example receiver.

FIG. 11 illustrates basically side-by-side electrodes 24 and 14b. As shown, electrode 14b slightly extends into the straight-line path 13b so the OFF condition is detected by it. Electrode 24 is positioned to capture the electron beam when it is deflected to the 13a path in the ON condition.

Figure 12:
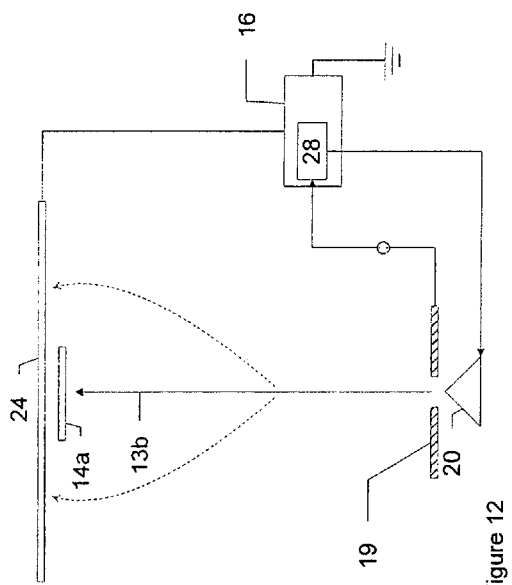
FIG. 12 is an alternative example receiver.

In earlier embodiments, we described the detector referenced from an ON electrode to an OFF electrode, from and ON electrode to ground, and from and OFF electrode to ground. In FIG. 12 we illustrate detectors that provide improved sensitivity and noise-reduction by referencing the received electron beam to the cathode. In FIG. 12, the principle of the detector referenced to an electric characteristic of the cathode is shown. Although not limiting, the example embodiment shows the OFF electrode 14a receiving the OFF path 13b and the ON electrode 24 receiving the ON paths 13a and 13c. In generally, when the electron beam follows the path 13b, the detector receives the beam and references it to an electrical characteristic that it receives from the cathode (or another element associated with the electron beam source). In that way, noise associated with the electron beam source can be cancelled. The OFF electrode can be grounded, Faraday cupped, etc. The ON electrode 24 is electrically coupled to the detector 16. Inside detector 16 is a current detector 28 that measures the current between the cathode 20 and anode 19. In operation, when the electron beam is deflected to the electrode 24, the current in that electrode 24 is detected by the detector 16 (and then diverted ground, a Faraday cup, etc.) and referenced to the current detected by detector 28 such that noise in the electron beam source can be cancelled, improving detection sensitivity.

Figure 14:
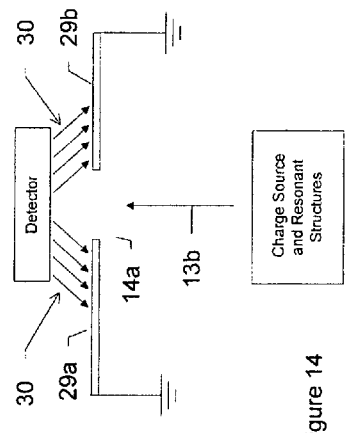
FIG. 14 is an example secondary electron shield on an example receiver.
Figure 13:
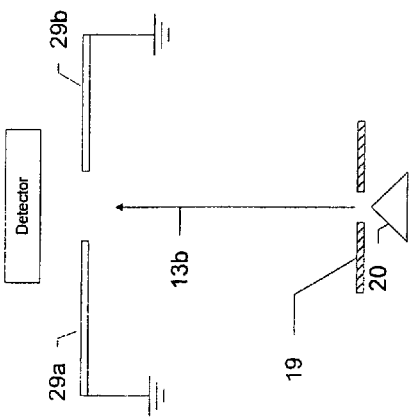
FIG. 13 is an alternative example receiver.

One way that that noise can corrupt the decoding process is by stray electrons bouncing from the receiving electrode (either the ON or OFF electrode) rather than being captured thereby. The shield 29a/29b in FIGS. 13 and 14 illustrate an example option that can reduce the strays. Specifically, it is advantageous to keep stray electrons out of the area where the electron beam 13 (either deflected or non-deflected) will be traveling to avoid collisions between the stray electrons and the electrons in the beam 13. The shields 29a and 29b are grounded and sit in front of (relative to the beam path) the detector being employed in order to provide the stray electrons another "to-ground" attraction before they enter the area where the electron beam 13 is traveling. The shields 29a and 29b can be employed with any type of detector (for example, any of FIGS. 7-12).

Figure 17:
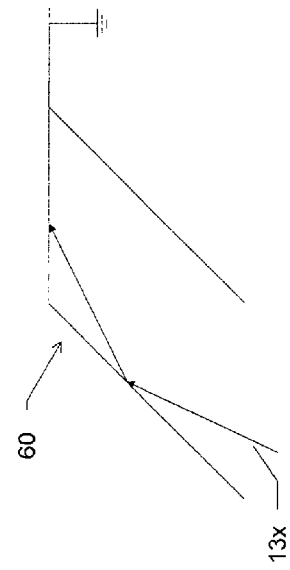
FIG. 17 is a close-up view of a portion of the secondary detector of FIG. 16.
Figure 16:
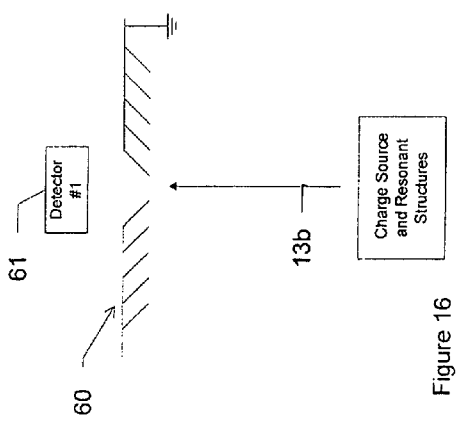
FIG. 16 is an example secondary detector.

FIGS. 16 and 17 describe an optional electrode structure that will also better capture the electrons in the electron beam 13, thereby reducing the possibility of stray electrons returning "up-stream" and interfering with the electron beam 13. In FIG. 16, the electrode 60 (which can be any of the electrode embodiments earlier described) is in the structural form of a baffle such that approaching electrons in the beam 13 have a multiple chance of being absorbed. In FIG. 16, only the OFF electrode 60 is shown with the baffles, but the ON detector electrode 61 can also (or instead) be baffled. The baffles are more particularly shown in FIG. 17, where the electron beam 13x is shown bouncing (instead of being absorbed) on the electrode 60 and yet then being absorbed on the second encounter with the electrode 60 (after the bounce). This improves signal detection and signal-to-noise ratio, and reduces the possibility of stray electrons re-entering the area where the electron beam 13 is encountering the resonant structures 12.

Figure 15:
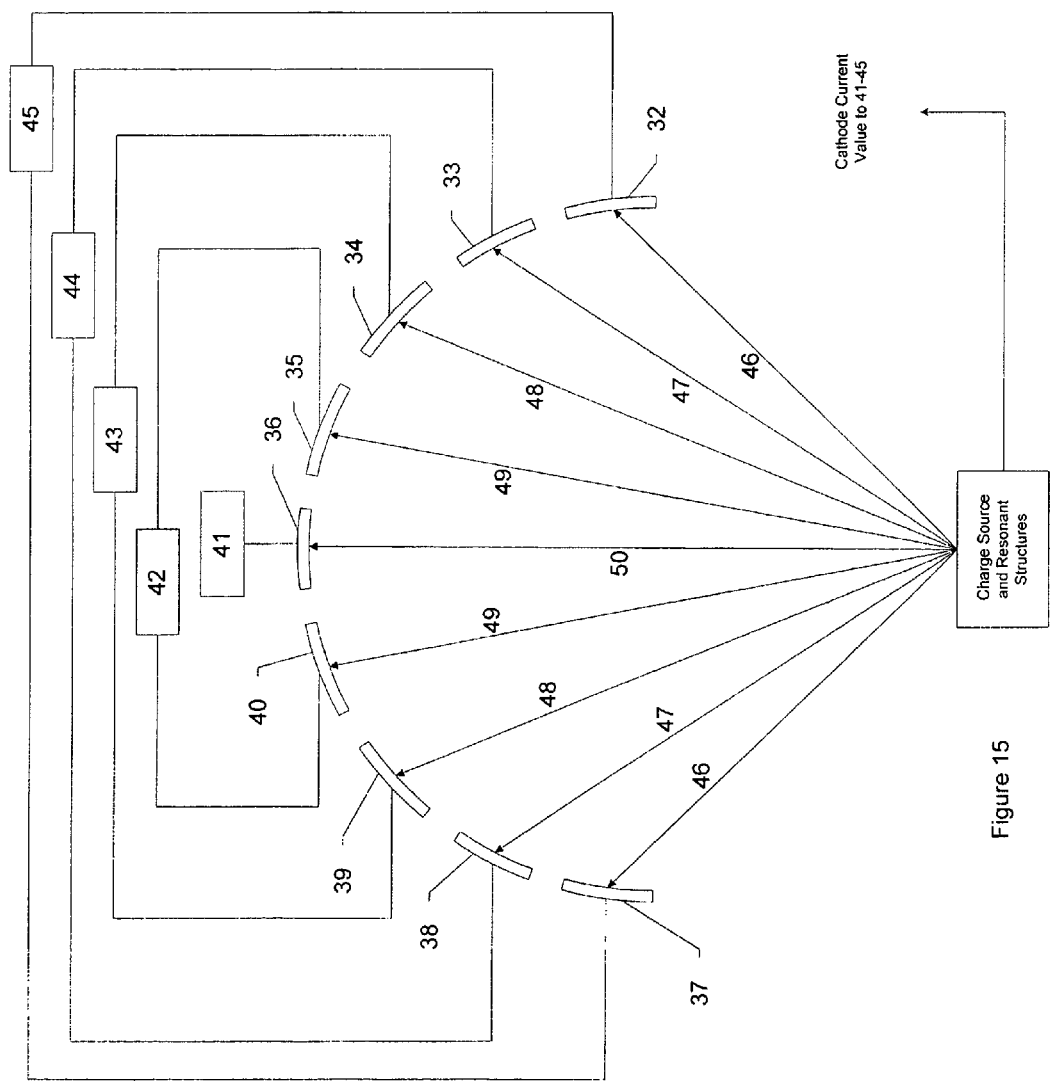
FIG. 15 is an example amplitude-modulated receiver.

FIG. 15 illustrates an AM (amplitude demodulation) detector based on the above-described detector principles. As shown, the cathode, anode, and resonant structures of, for example FIG. 1, are combined into the box "Charge Source and Resonant Structures" but basically operate according to the principles outlined in FIG. 1. In this case, however, the encoded light 15 contains data from the data source 18 that is modulated with more than two binary conditions. Thus, the encoded light invokes the electric field in the resonant structures in accordance with a characteristic of the light (for example, intensity, frequency, polarity, etc.) such that the electric field in the resonant structures bears an amplitude relation to the light characteristic. The data from the data source 18 can then be encoded by the light characteristic such that greater than two data states—and indeed within the limits of practicality, infinite data states can be amplitude modulated on the data source.

Once the light characteristic is encoded, the resonant structures encountering that light 15 respond by electric field amplitude changes in accordance with the light characteristic. The electron beam 13 passing close to the resonant structures couple that amplitude characteristic and deflect at an angle commensurate with the amplitude modulation. Thus, high amplitude modulation can result in the beam diversion to path 46 and onto electrodes 32/37, where it is detected by detector portion 45. Lesser amplitudes result in beam path diversions to paths 47, 48, and 49, respectively encountering electrodes 33/38, 34/39 and 35/40 and detector portions 44, 43, and 42. No diversion (i.e., a "0" amplitude state) results in no diversion of the beam path 13 and thus a path 50 into electrode 36 detected by detector portion 41. It can thus be seen that "analog" differences in light characteristic can be detected by amplitude demodulation. The sensitivity of the data can be adjusted based on the number and size of the electrodes 32-40. By adding more electrodes, a greater number of differentiated amplitude increments can be detected and thus greater data volume can be encoded.

Figure 19:
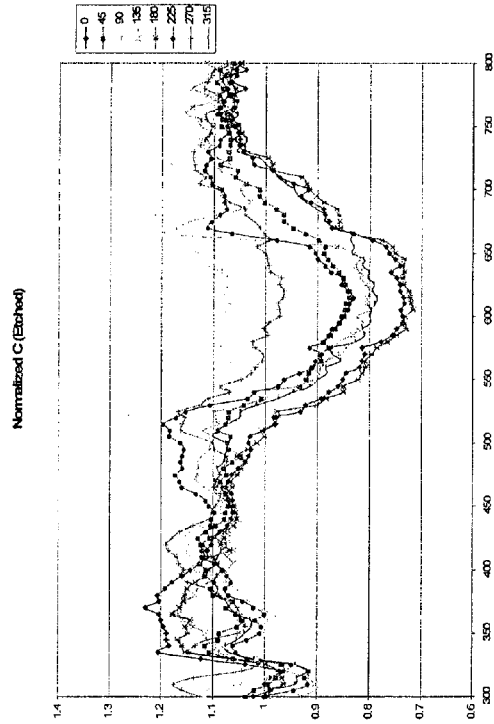
FIG. 19 is a representation of experimental results from a resonant receiver structure.

FIG. 19 illustrates a graph of percent reflectivity (Y-axis) versus wavelength of light measured in nm (X-axis). In the experiment, different length ultra-small resonant structures were arranged on a substrate and light of different frequencies and polarities was directed near the structures. The different curves represent the degrees of polarization of the light (in 45 degree increments) relative to the long dimension of the finger length. The percent reflectivity in this experiment indicates the percent of reflection off of a surface with a resonant structure versus a surface without one, thus indicating inversely the amount of light energy absorbed by one or more of the ultra-small resonant structures located on the substrate. The dominant "dips" in the graph illustrate wavelengths of the light that were absorbed well by one or more of the resonant structures at the polarity shown. Other light frequencies and finger lengths could be mapped and used as alternatives. The graph is significant to show that the resonant structures are in fact absorbing the encoded light energy. The graph is also significant in illustrating the effect of polarization angle on the absorption. In essence, the graph illustrates that absorption occurs and that it is enhanced when polarization of the light is parallel to the finger length. The graphs for polarization angles 0 and 180 show large absorption at the dips and for angles 90 and 270, for example show lower absorption.

From FIG. 19, one can ascertain various light characteristics that can be employed for linear (or non-linear) amplitude modulation employed by, for example, the structure of FIG. 15. Light intensity of the encoded light 15 affects electric field strength produced in the resonant structures 12 and thus can be used to angularly modulate the beam path. So too can changes in polarization and light frequency, such that they too can be used to encode the data on the light 15 to produce a corresponding path alteration in the electron beam 13 at the receiver 10.

Figure 20:
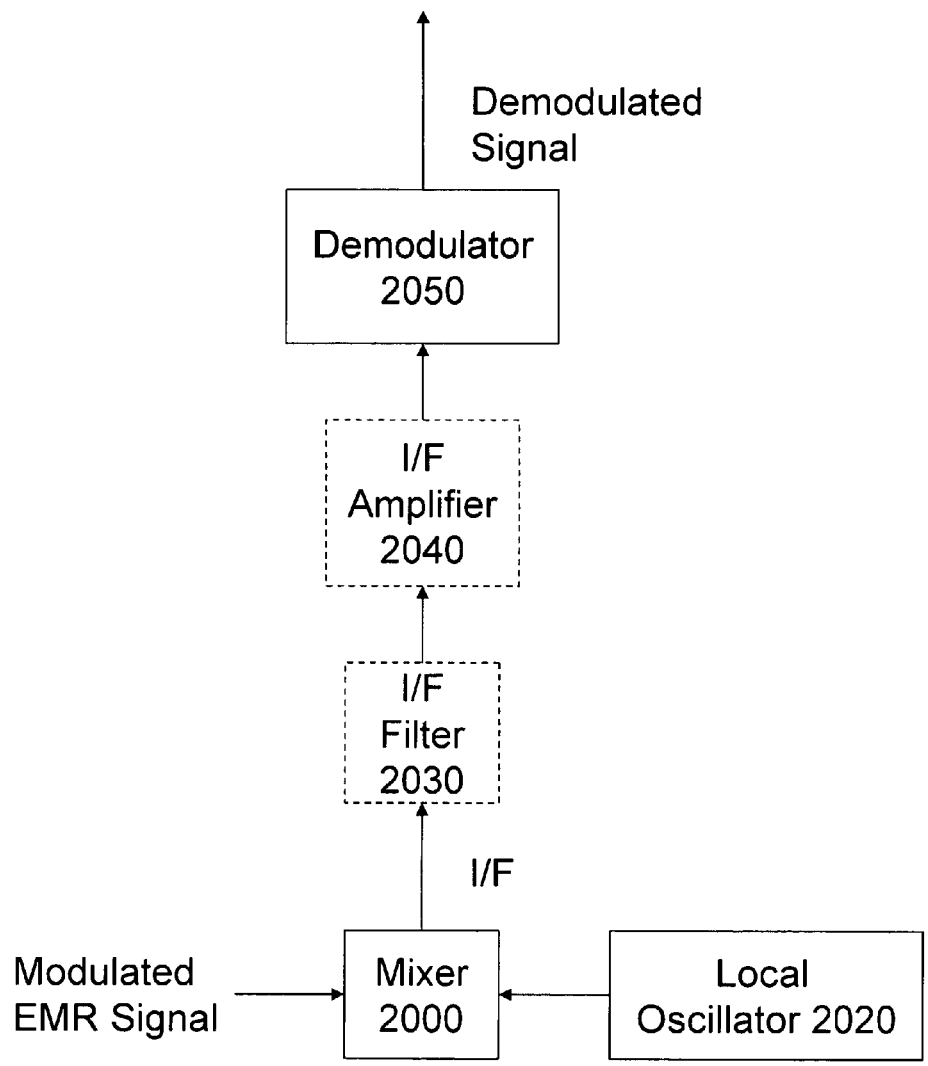
FIG. 20 is a block diagram of the general components of a heterodyne receiver.

As shown in FIG. 20, a heterodyne receiver can be built such that an input signal representing a modulated EMR signal is received by a mixer 2000. The mixer 2000 also receives a signal from a local oscillator 2020. The mixer 2000 combines the input signal and the signal from the local oscillator 2020 to produce two beat frequencies representing the sum and the difference of the two signals. Typically the difference of the two signals is the signal of interest and termed the "intermediate frequency" or IF. The IF represents the signal that was added to the carrier wave on the transmitter side. Depending on the application, the IF may be applied to an intermediate frequency filter 2030 and/or an IF amplifier 2040. The resulting signal is then applied to a demodulator 2050 to produce the demodulated signal.

Figure 21:
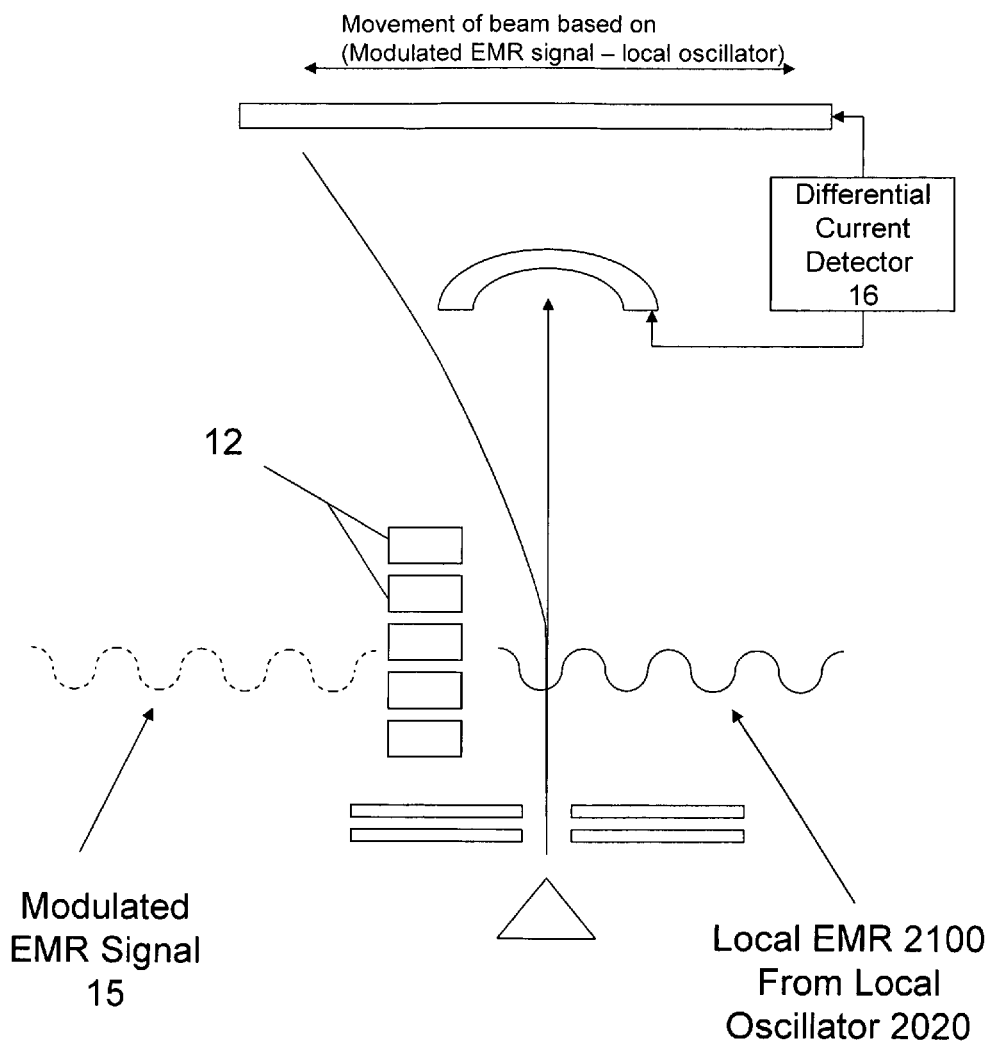
FIG. 21 is a block diagram of an exemplary heterodyne receiver according to the present invention.

Using the techniques of FIG. 20, a heterodyne receiver that operates up to optical frequencies can be constructed, e.g., as shown in FIG. 21. As seen in FIG. 21, ultra-small resonant structures 12 respond to a modulated EMR signal 15, as described above. However, when the ultra-small resonant structures 12 are also in the presence of a local oscillating source of electromagnetic energy, the ultra-small resonant structures 12 resonate at the beat frequencies which are the sum and the difference of the modulated EMR signal 15 and the local EMR 2100 from the local oscillator 2020. By measuring the differential current with a differential current detector 16, the intermediate frequency corresponding to the difference of the modulated EMR signal 15 and the local EMR 2100 from the local oscillator 2020 (e.g., a laser or another EMR source such as is described in the above-referenced co-pending application entitled "Micro Free Electron Laser (FEL)") can be determined. The intermediate frequency optionally can then be filtered and/or amplified, either using actual circuitry or via digital signal processing. The intermediate frequency or the amplified/filtered intermediate frequency can then be applied to a demodulator to obtain the signal that was modulated on the carrier wave at the transmitter.

Figure 22A:
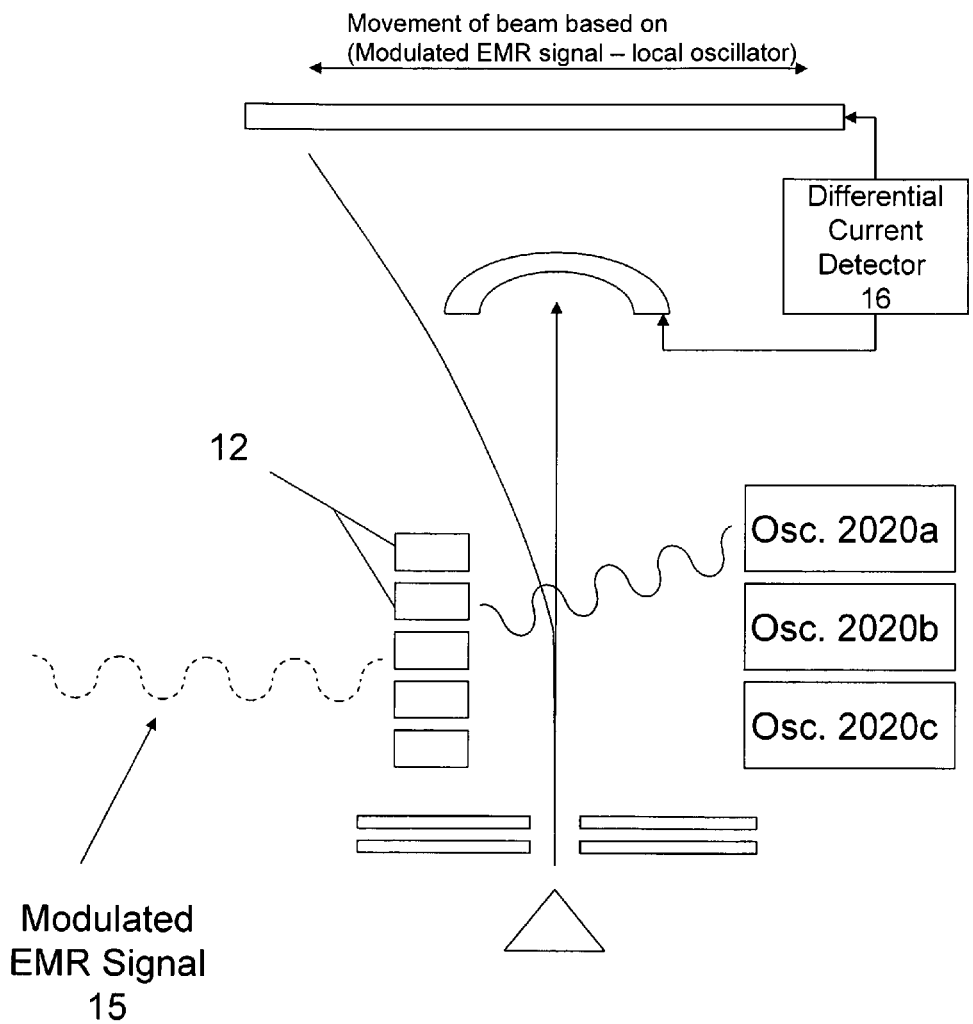
FIGS. 22a-22c are block diagrams of a multi-frequency heterodyne receiver according to the present invention.
Figure 22B:
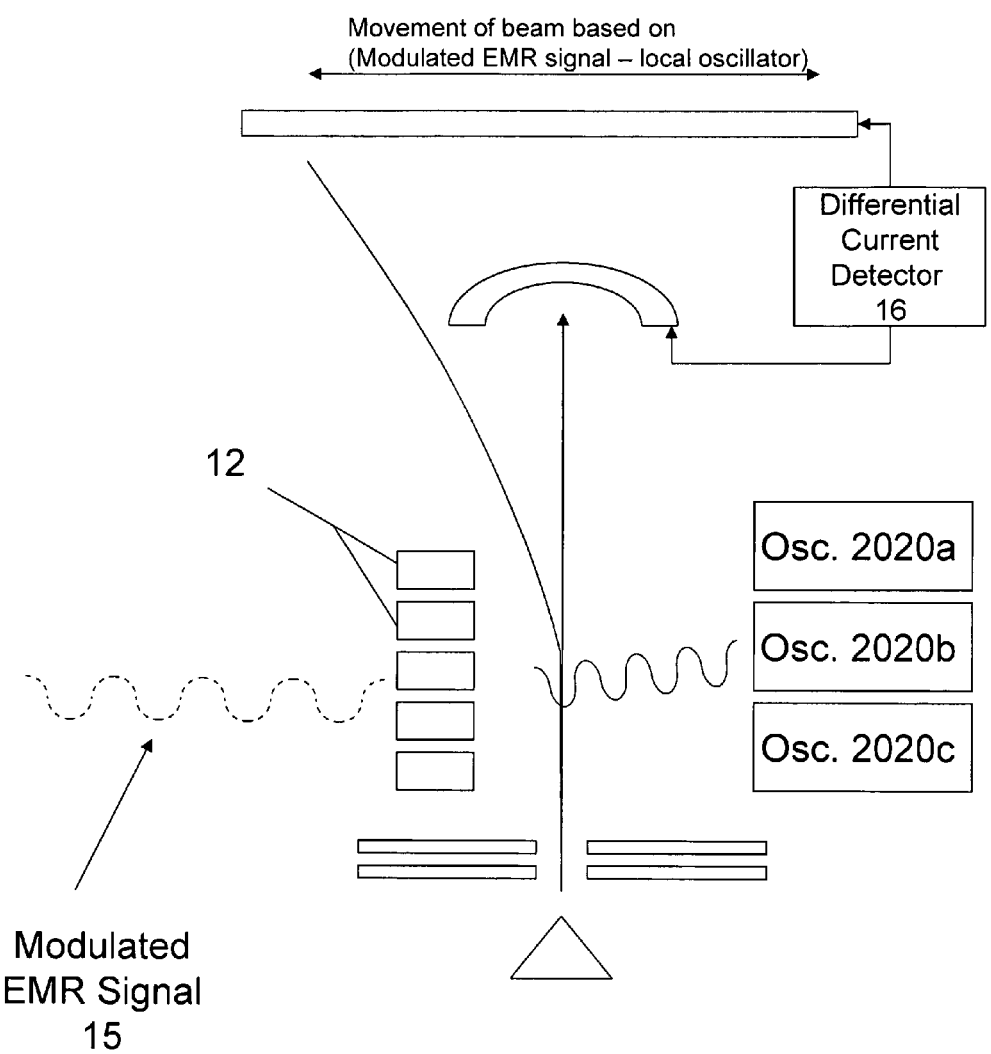
Figure 22C:
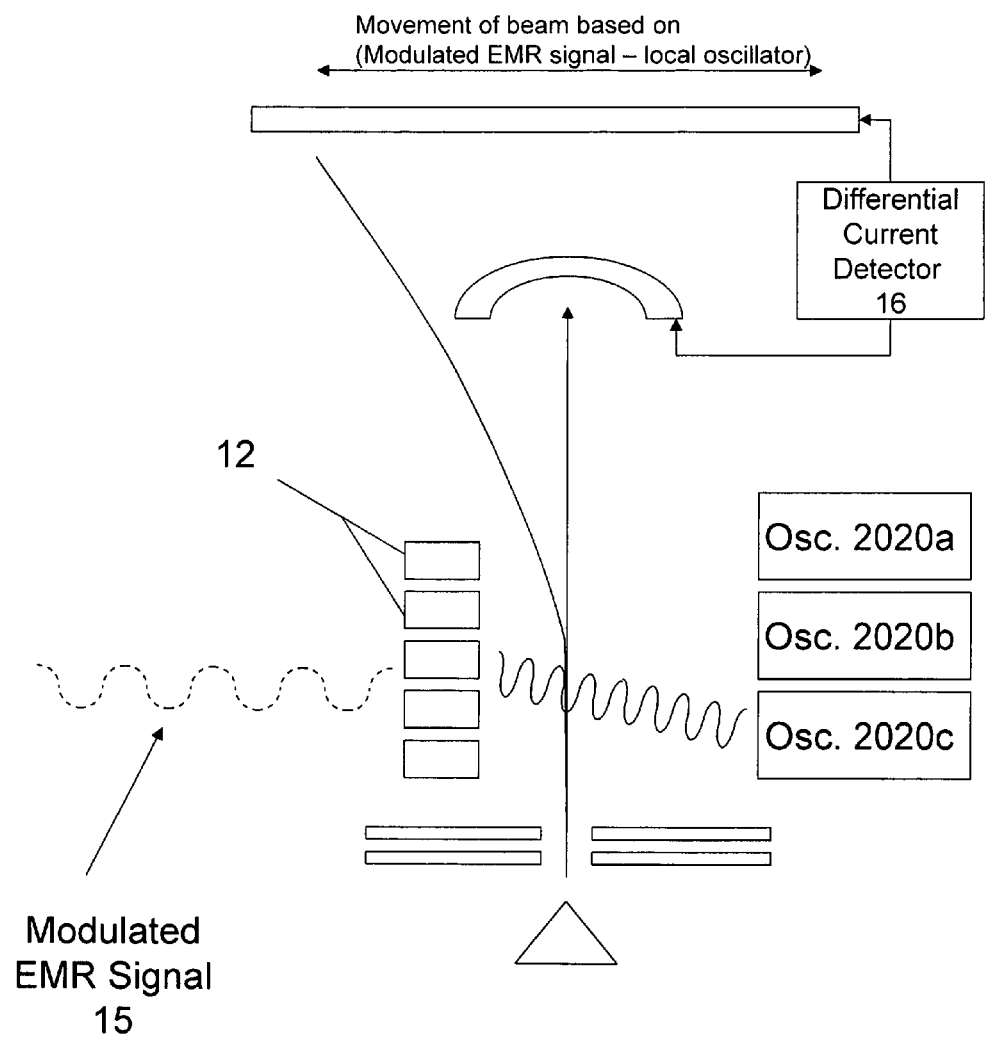

In an alternate embodiment shown in FIGS. 22a-22c, the heterodyne receiver of FIG. 21 is modified to include plural local oscillators 2020a-2020c such that the local EMR 2100 can be selected to be one of a number of frequencies, depending on the how the receiver is tuned. For example, when used in conjunction with a multi-frequency transmitter, a multi-frequency receiver, as shown in FIGS. 22a-22c can first receive a signal modulated on a first carrier frequency by using oscillator 2020a as the local oscillator (and blocking the outputs of local oscillators 2020b and 2020c). When attempting to receive a signal modulated on a second carrier frequency, the outputs of oscillators 2020a and 2020c can be blocked, and oscillator 2020b can be used as the local oscillator.

Figure 23:
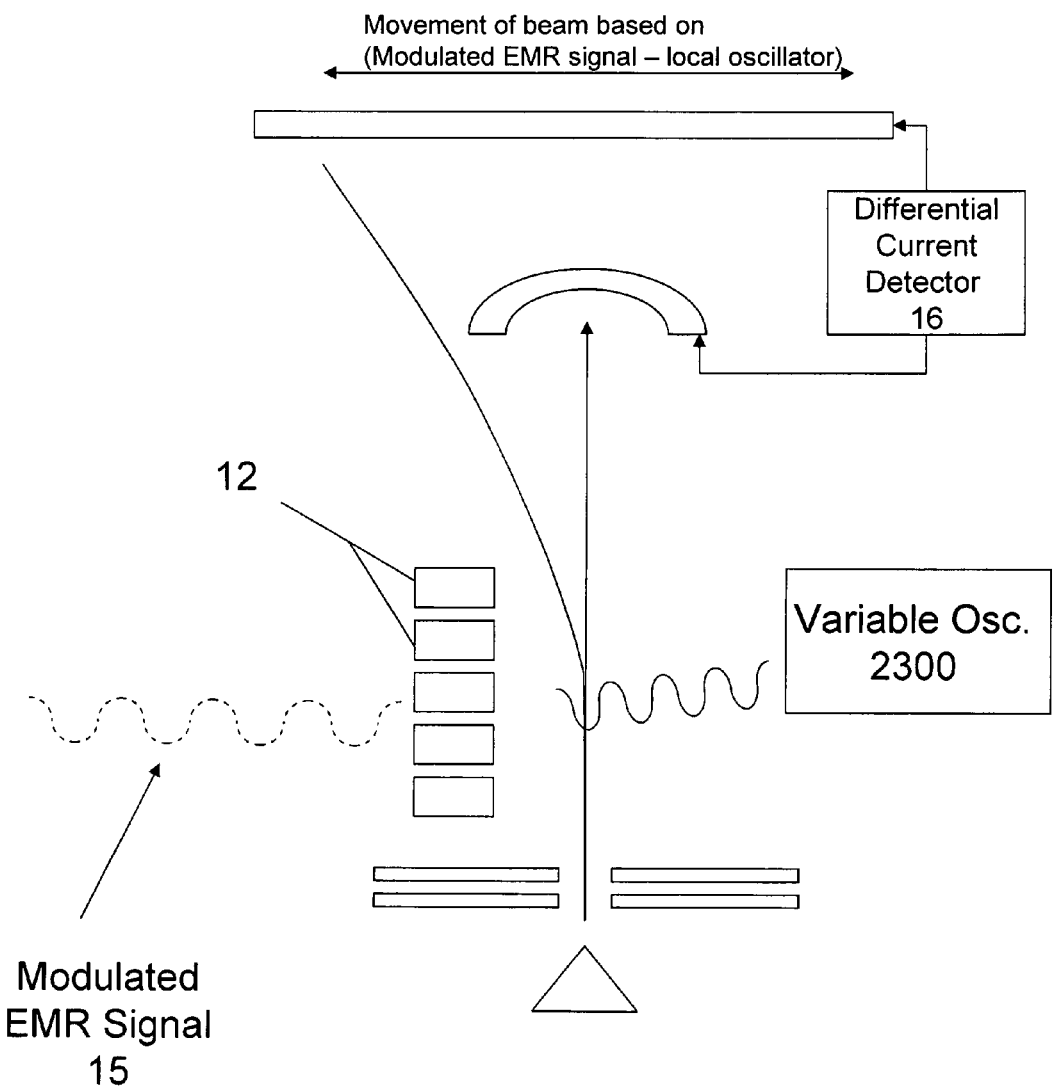
FIG. 23 is a block diagram of an exemplary multi-frequency heterodyne receiver using a variable oscillator according to the present invention.

In yet another embodiment shown in FIG. 23, a variable oscillator 2300 can be used to replace the plural local oscillators 2020a-2020c of FIGS. 22a-22c. In this embodiment, the variable oscillator 2300 can be tuned to the frequency corresponding to the carrier frequency of the signal that is desired to be demodulated. Intel Corporation of California manufactures a tunable laser system which can be used as the variable oscillator by providing applying (e.g., via an optical interconnection such as fiber optic cable) the output of the laser to the resonant structure acting as a mixer.

In an alternate embodiment, the variable oscillator 2300 can instead be a series of other resonant structures which are excited by one or more charged particle beams. Which one of the series of resonant structures is selected may depend on an input to the variable oscillator 2300 where the input controls a deflector which varies an amount of deflection of the charged particle beam. Additional details of such a set of selectable resonant structures and their deflector can be found in co-pending U.S. application Ser. No. 11/410,924, (Attorney Docket No. 2549-0010) described in greater detail above. Such resonant structures may each include at least one corresponding filter to filter out frequencies other than the desired predominant frequency corresponding to the selected resonant structure. For example, if the deflector selects a first resonant structure to act as the oscillating frequency, that resonant structure may produce relatively small amounts of other, non-predominant frequencies. Thus, such a filter filters out the relatively small amounts of other, non-predominant frequencies.

While certain configurations of structures have been illustrated for the purposes of presenting the basic structures of the present invention, one of ordinary skill in the art will appreciate that other variations are possible which would still fall within the scope of the appended claims. While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A receiver to demodulate a modulated signal from electromagnetic radiation, comprising:

a local oscillator providing locally generated electromagnetic radiation;

an input for receiving remotely generated electromagnetic radiation corresponding to the modulated signal;

a resonant structure adjacent to, but not directly in, the path of a passing charged particle beam that receives at least a portion of the remotely and locally generated electromagnetic radiation and resonates at a frequency that is a function of the frequencies of the locally and remotely generated electromagnetic radiation; and at least one charged particle absorption element receiving at least a portion of the charged beam as a function of the frequencies of the locally and remotely generated electromagnetic radiation such that the modulated signal can be extracted from the remotely generated electromagnetic radiation.

2. The receiver according to claim 1 wherein the resonant structure is a rectangular shape or a C shape.

3. The receiver according to claim 1 wherein the resonant structure is a shape having a relatively small face to the charged particle beam relative to the total perimeter of the resonant structure.

4. The receiver according to claim 3 wherein the resonant structure is triangular and a point of the triangle is facing the charged particle beam.

5. The receiver according to claim 1 wherein the resonant structure is a shape that concentrates an electric field induced by the electromagnetic radiation near the passing charged particle beam.

6. The receiver according to claim 1, further including:
a detector to detect whether the electrode is receiving at least the portion of the charged particle beam.

7. The receiver according to claim 1, further including:
a detector to detect which of the first and second charged particle absorption elements is receiving the charged particle beam.

8. The receiver according to claim 1 wherein the first charged particle absorption element is a Faraday cup and the second charged particle absorption element is an electrode.

9. The receiver according to claim 1, further including a source of electrons such that a beam of electrons acts as the beam of charged particles.

10. The receiver according to claim 1, wherein the resonant structure has a dimension smaller than the wavelength of the electromagnetic radiation.

11. The receiver according to claim 1, wherein the local oscillator comprises an ultra-small resonant structure.

12. The receiver according to claim 1, wherein the local oscillator comprises a variable oscillator tuned to a selected frequency.

13. The receiver according to claim 1, wherein the local oscillator comprises one of plural selectively-controlled local oscillators.

14. The receiver according to claim 1, wherein the local oscillator comprises one of plural selectively-activated ultra-small resonant structure selected by a deflector.

15. A method of demodulating a modulated signal from electromagnetic radiation, comprising:

receiving locally generated electromagnetic radiation from a local oscillator;

receiving remotely generated electromagnetic radiation corresponding to the modulated signal;

receiving, at a resonant structure adjacent to, but not directly in, the path of a passing charged particle beam, at least a portion of the remotely and locally generated electromagnetic radiation;

resonating the resonant structure at a frequency that is a function of the frequencies of the locally and remotely generated electromagnetic radiation; and receiving, at at least one charged particle absorption element, at least a portion of the charged beam as a function of the frequencies of the locally and remotely generated electromagnetic radiation such that the modulated signal can be extracted from the remotely generated electromagnetic radiation.

16. The method of demodulating according to claim 15 wherein the resonant structure is a rectangular shape or a C shape.

17. The method of demodulating according to claim 15 wherein the resonant structure is a shape having a relatively small face to the charged particle beam relative to the total perimeter of the resonant structure.

18. The method of demodulating according to claim 15 wherein the resonant structure is a shape that concentrates an electric field induced by the electromagnetic radiation near the passing charged particle beam.

19. The method of demodulating according to claim 15, further including detecting which of the first and second charged particle absorption elements is receiving the charged particle beam.

20. The method of demodulating according to claim 15, wherein the local oscillator comprises an ultra-small resonant structure.

21. The method of demodulating according to claim 15, wherein the local oscillator comprises one of plural selectively-activated ultra-small resonant structure selected by a deflector.

* * * * *